(12) United States Patent
Kajiyama et al.

(10) Patent No.: US 7,714,987 B2
(45) Date of Patent: May 11, 2010

(54) EXPOSURE APPARATUS

(75) Inventors: Kazuhiko Kajiyama, Utsunomiya (JP);
Toshihiko Tsuji, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 413 days.

(21) Appl. No.: 11/870,626

(22) Filed: Oct. 11, 2007

(65) Prior Publication Data

US 2008/0088814 A1    Apr. 17, 2008

(30) Foreign Application Priority Data

Oct. 13, 2006    (JP) .............................. 2006-280783

(51) Int. Cl.
*G03B 27/72*    (2006.01)

(52) U.S. Cl. .............................. 355/67; 355/53; 355/66; 359/852

(58) Field of Classification Search .................. 355/53, 355/66, 67, 71, 68; 359/364, 852, 853, 857; 356/399, 400; 250/548; 430/311
See application file for complete search history.

(56) References Cited

U.S. PATENT DOCUMENTS 5,439,781 A * 8/1995 MacDowell et al. ........ 430/311

2005/0105290 A1    5/2005 Tsuji

FOREIGN PATENT DOCUMENTS

JP    2005-141158    6/2005

* cited by examiner

*Primary Examiner*—Hung Henry Nguyen
*Assistant Examiner*—Colin Kreutzer
(74) *Attorney, Agent, or Firm*—Rossi, Kimms & McDowell LLP

(57) ABSTRACT

An exposure apparatus includes a first optical unit configured to condense light from a light source, a catoptric integrator configured to form plural secondary light sources using light from the first optical unit, the catoptric integrator including plural cylindrical reflection surfaces having the same generatrix direction, an aperture stop arranged perpendicular to the generatrix direction, and a second optical unit configured to superpose light from each secondary light source onto an illumination surface, wherein the catoptric integrator includes plural integrator parts each having plural cylindrical reflection surfaces, and the plural integrator parts are arranged in a direction perpendicular to the generatrix direction and to an arrangement direction of the cylindrical reflection surfaces and located at an incident side of the aperture stop.

7 Claims, 24 Drawing Sheets

PRIOR ART
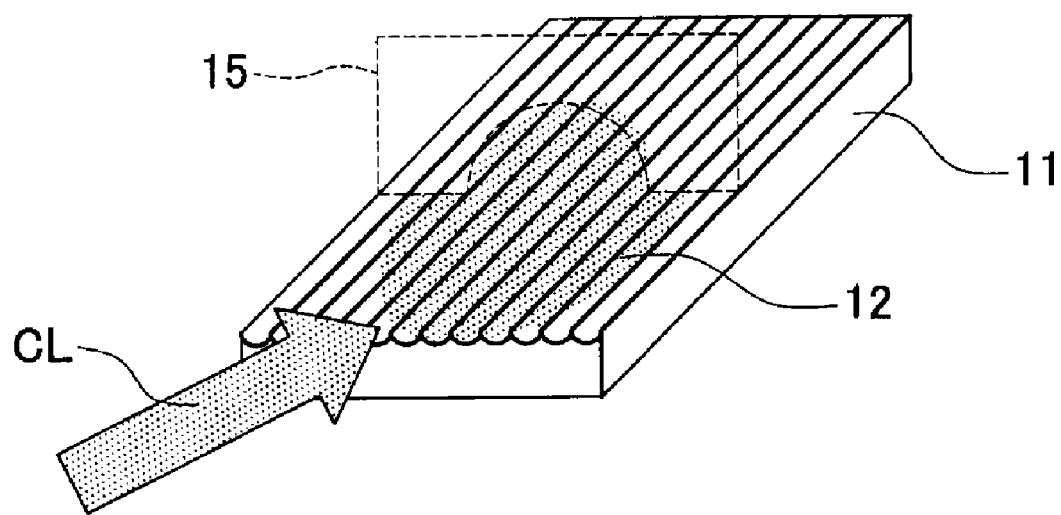
F I G . 1

PRIOR ART
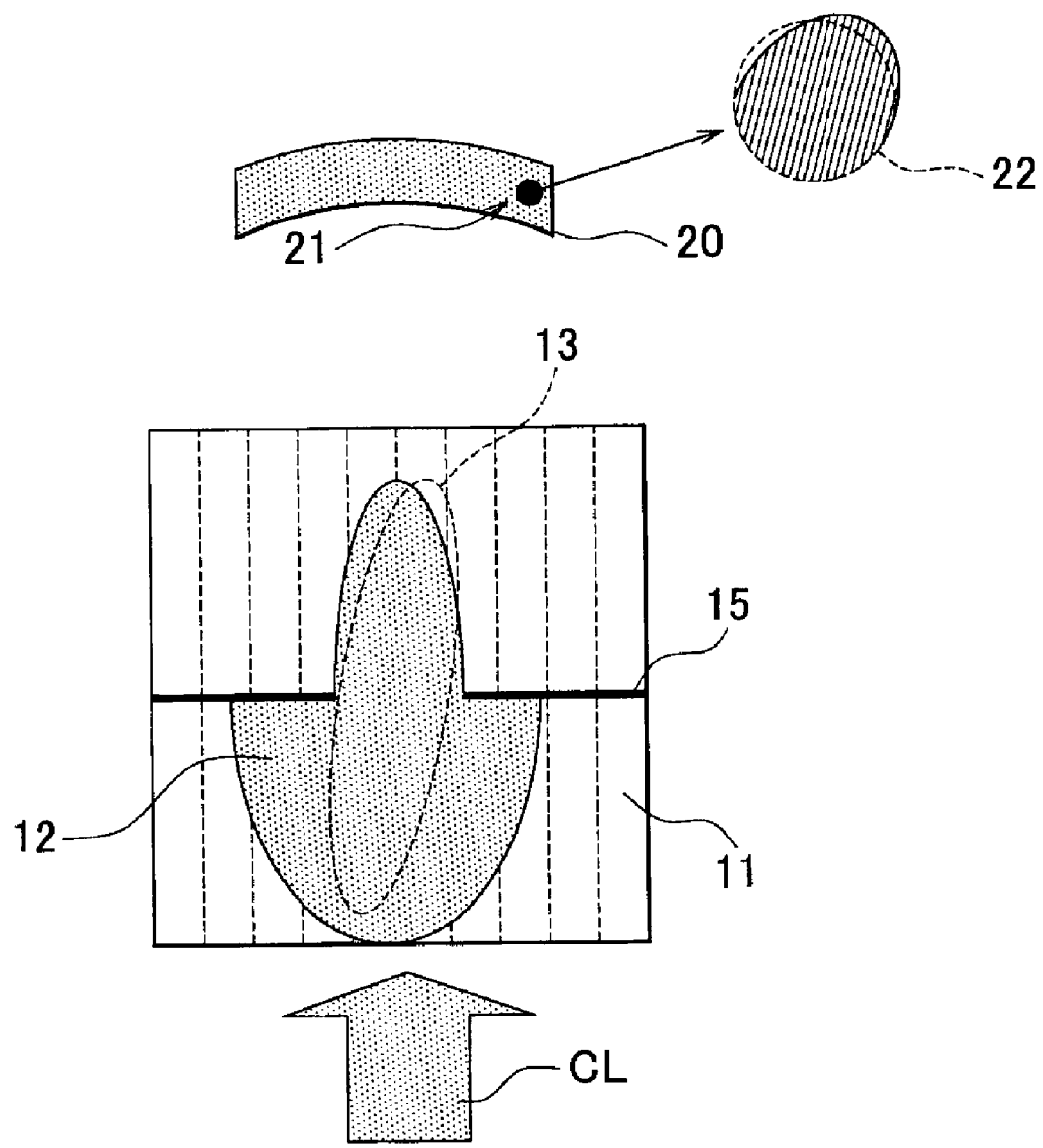
F I G . 2

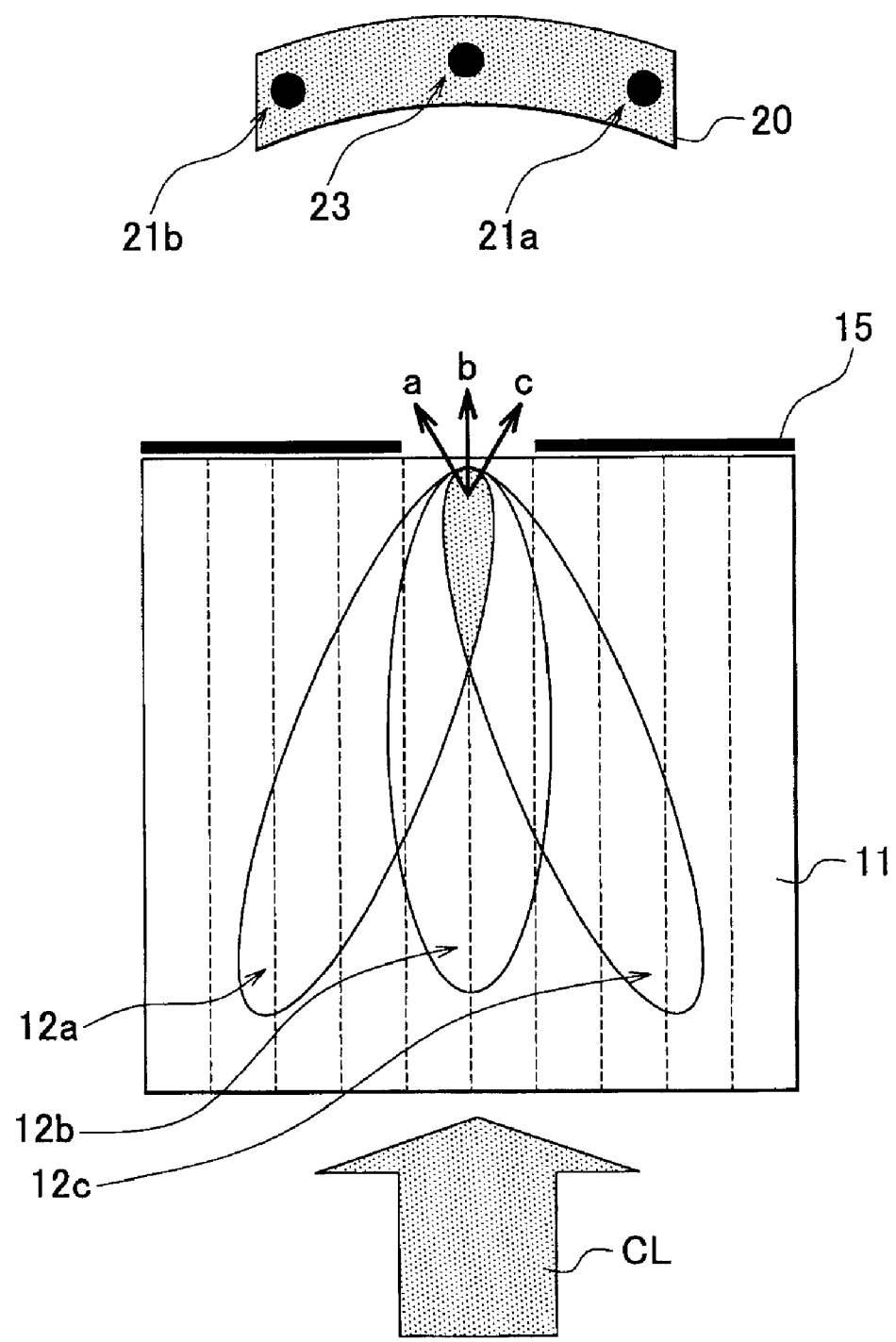
F I G. 14A

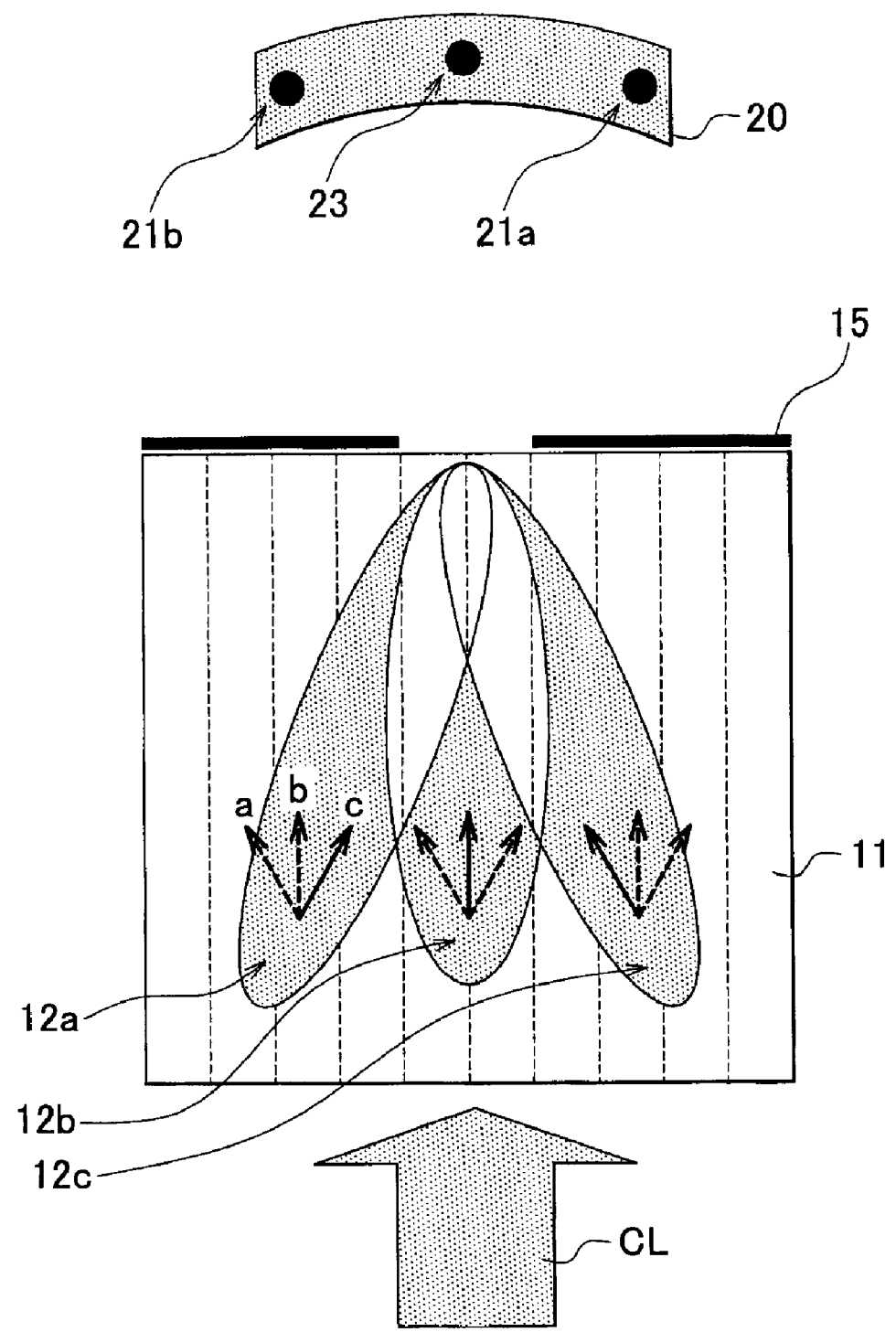
F I G. 14C

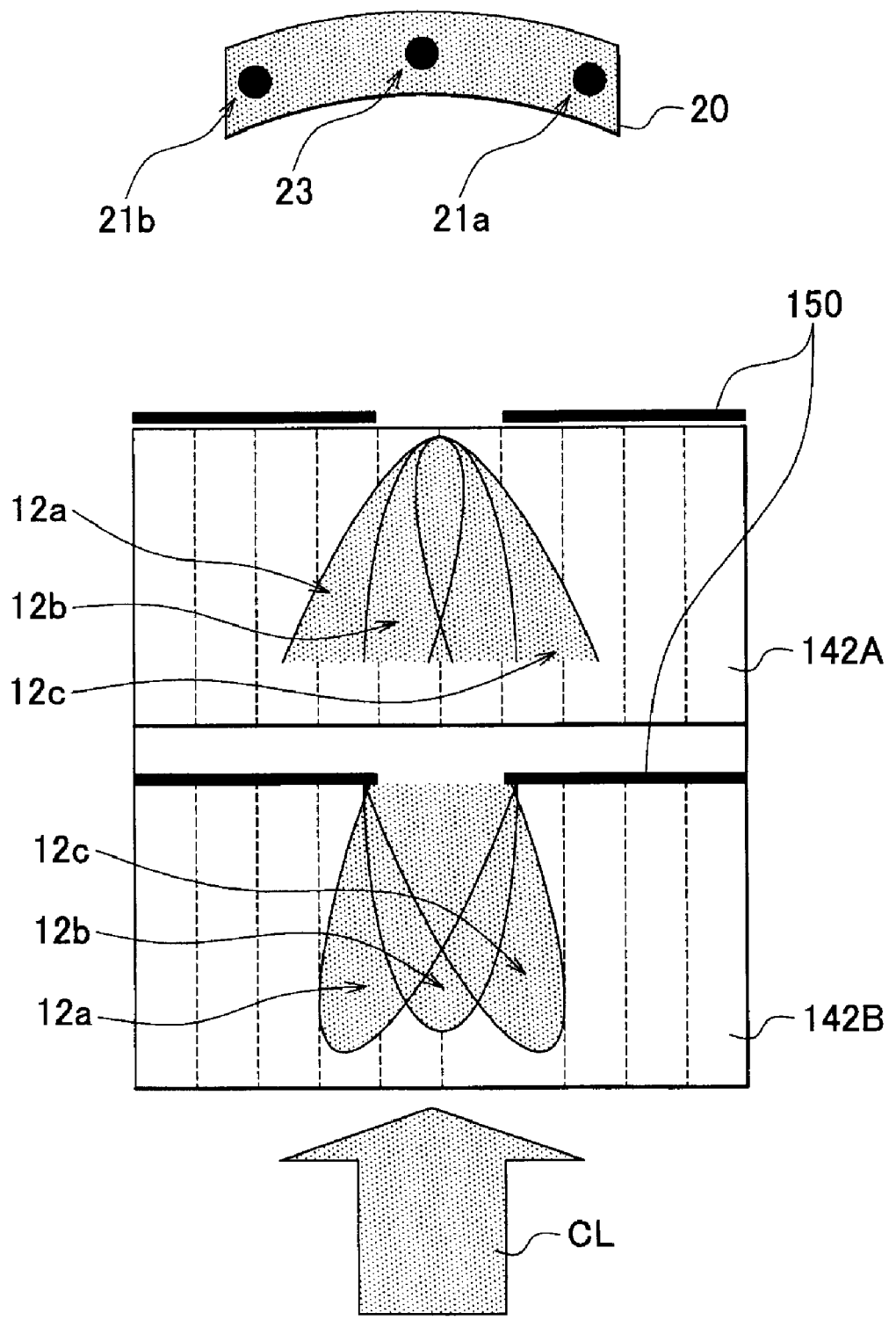
F I G. 15

EXPOSURE APPARATUS

BACKGROUND OF THE INVENTION

The present invention relates to an exposure apparatus.

In order to meet the recent resolution improvement requirement, a projection exposure apparatus is proposed which projects a mask pattern onto a wafer using the extreme ultraviolet ("EUV") light having a wavelength between 10 nm and 20 nm, and is referred to as a "EUV exposure apparatus" hereinafter.

A conventional illumination optical system applicable to the EUV exposure apparatus arranges an aperture stop having a semicircular aperture on a corrugated integrator for good illuminations with the small number of mirrors and no relay optical system. See, for example, Japanese Patent Laid-Open No. ("JP") 2005-141158. The corrugated integrator is an integrator having plural cylindrical reflection surfaces having the same generatrix direction.

It is known that high-quality imaging with a projection optical system requires a restrained distortion of an effective light source of the illumination optical system viewed from each position on an illumination surface that is a target plane to be illuminated.

The illumination optical system disclosed in JP 2005-141158 sufficiently restrains the distortion of the effective light source for the prior art those days, but this inventor has studied and discovered that the illumination optical system in JP 2005-141158 still contains a remaining distortion that is not negligible.

The distorted effective light source of the illumination optical system in JP 2005-141158 results from partial shielding of the collimated light by the aperture stop before it forms the secondary light source. This phenomenon will be described in detail with reference to FIGS. 1 and 2.

FIG. 1 is a schematic perspective view of an arrangement of the aperture stop 15 and the integrator 11 in JP 2005-141158. An area 12 illuminated by collimated light CL on the integrator 11 narrows at an exit side of the aperture stop 15. FIG. 2 is a top view of the integrator 11 shown in FIG. 1. In order to obtain an effective light source having a regular circle at an end 21 in an arc illumination surface 20, the collimated light CL needs to be irradiated onto an area 13 shown by a dotted line.

At an incident side of the aperture stop 15, i.e., the lower half area in the top view of FIG. 1, the area 13 overlaps the area 12 and secures an area necessary for a regular circle of the effective light source. The aperture stop 15 shields the unnecessary light outside the area 13. The lower half area of the aperture stop 15 in FIG. 2 corresponds to the lower half area of the effective light source in FIG. 2, and the lower half area of the effective light source 22 has a semicircle with no distortion.

On the other hand, the exit side of the aperture stop 15, i.e., the upper half area in the top view of FIG. 2 contains a non-overlap area between the areas 13 and 12 and causes a shift from the regular circle of the effective light source. The area in the area 13 which receives no light causes an effective light source 22 to have a shape out of round. The unnecessary light outside the area 13 is not shielded because there is no subsequent stop, and the effective light source 22 has a shape that projects from the regular circle.

The configuration of the illumination optical system disclosed in JP 2005-141158 thus remains a slight distortion in the effective light source, and cannot meet a higher imaging characteristic requirement.

SUMMARY OF THE INVENTION

The present invention is directed to an exposure apparatus that provides good illuminations through a restrained distortion of the effective light source.

An exposure apparatus according to one aspect of the present invention includes a first optical unit configured to condense light from a light source, a catoptric integrator configured to form plural secondary light sources using light from the first optical unit, the catoptric integrator including plural cylindrical reflection surfaces having the same generatrix direction, an aperture stop arranged perpendicular to the generatrix direction, and a second optical unit configured to superpose light from each secondary light source onto an illumination surface, wherein the catoptric integrator includes plural integrator parts each having plural cylindrical reflection surfaces, and the plural integrator parts are arranged in a direction perpendicular to the generatrix direction and to an arrangement direction of the cylindrical reflection surfaces and located at an incident side of the aperture stop.

A device manufacturing method according to another aspect of the present invention includes the steps of exposing a substrate using the above exposure apparatus, and developing the substrate that has been exposed.

A further object and other characteristics of the present invention will be made clear by the preferred embodiments described below referring to accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1 is a schematic perspective view of an arrangement of a conventional aperture stop and an integrator.

FIG. 2 is a schematic plane view for explaining the conventional illustration.

FIGS. 14A to 14C are schematic plane views for explaining a problem of a structure shown in FIG. 12.

FIG. 15 is a schematic plane view for explaining an effect of an arrangement shown in FIG. 3.

DESCRIPTION OF THE EMBODIMENTS

Embodiments of the present invention will now be described in detail in accordance with the accompanying drawings.

First Embodiment

Figure 3:
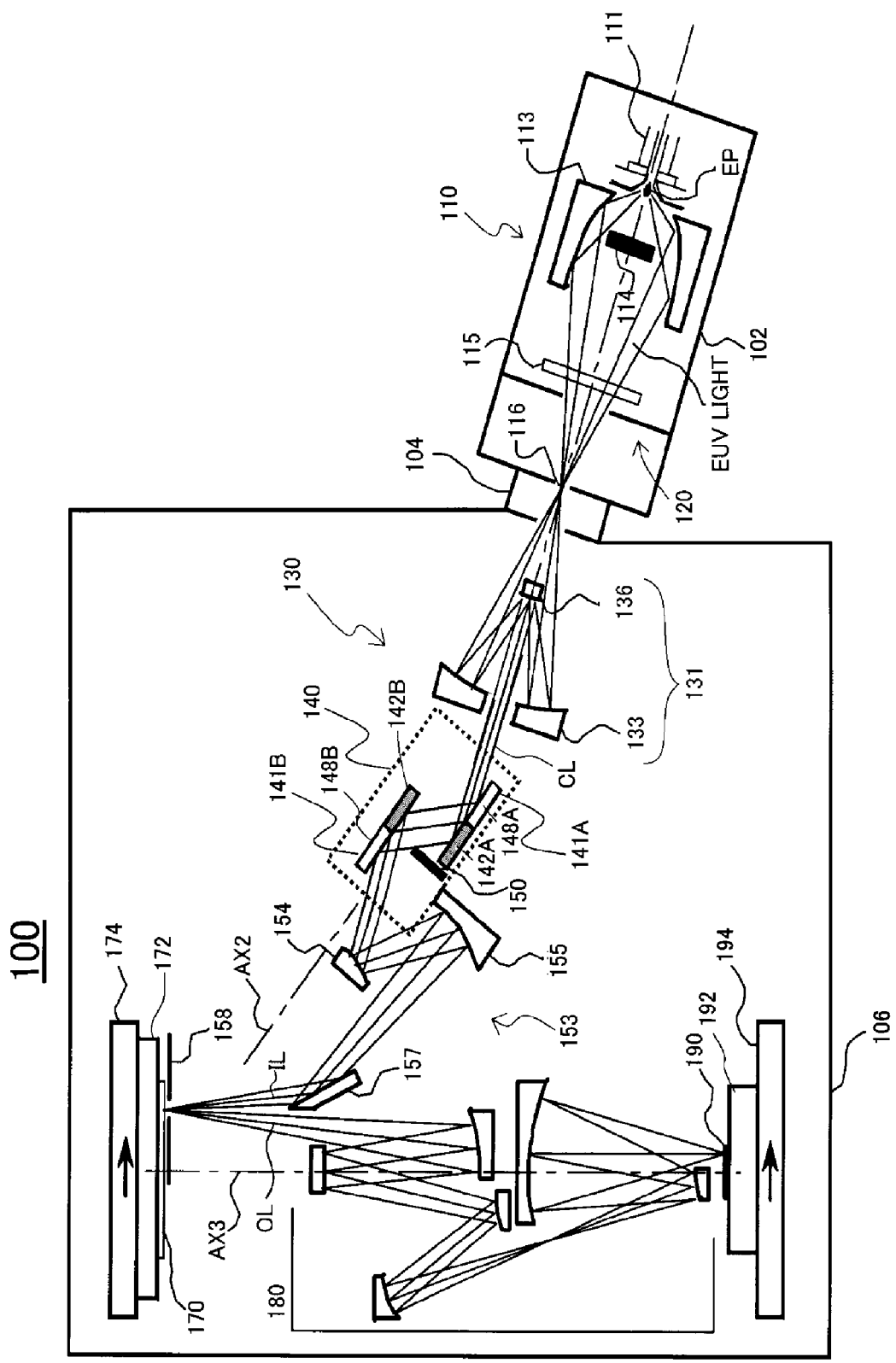
FIG. 3 is a schematic sectional view showing a structure of an exposure apparatus according to a first embodiment.

Referring now to FIG. 3, a description will be given of an exposure apparatus 100 according to a first embodiment. FIG. 3 is a schematic structural view of the exposure apparatus 100. The exposure apparatus 100 includes vacuum chambers 102 and 106, a connector 104 that connects them to each other, a light source section 110, an illumination optical system 130, a mask stage 174, a projection optical system 180, and a plate stage 194.

The vacuum chambers 102 and 106 and connector 104 accommodates components of the exposure apparatus 100, and maintain vacuum so as to prevent an attenuation of the EUV light. The vacuum chamber 102 accommodates the light source section 110. The vacuum chamber 106 accommodates the illumination optical system 130 to the plate 190.

The exposure apparatus 100 is a EUV exposure apparatus that exposes a circuit pattern of a mask 170 onto a plate 190 as a substrate using the EUV light (having a wavelength, for example, of 13.5 nm) as exposure light in a step-and-scan manner. The exposure apparatus 100 of this embodiment is a step-and-scan projection exposure apparatus (which is referred to as a so-called scanner), but may use a step-and-repeat manner or another exposure method.

An illumination apparatus illuminates the mask 170 having a circuit pattern to be transferred using the EUV light, and includes the light source section 110 and the illumination optical system 130.

The light source section 110 uses a discharge induced plasma light source in this embodiment, but a type of the light source is not limited, and may use a laser induced plasma light source, etc. The light source section 110 includes a discharge header 111, a condenser mirror 113, a filter 114, a wavelength filter 115, an aperture 116, and a differential pumping mechanism 120.

The condenser mirror 113 includes a rotational elliptical mirror etc. configured to collect the EUV light that is approximately isotropically radiated from a plasma emission part EP, and to condense it upon the illumination optical system 130. The filter 114 removes debris (flying particle) that occurs with a generation of the EUV light. The wavelength filter 115 removes the light having a wavelength other than the EUV light. The aperture 116 has a pinhole shape arranged near the condensing point of the condenser mirror 113. The differential pumping mechanism 120 decreases an internal pressure from the emission part EP to the vacuum chamber 106 step by step.

The illumination optical system 130 propagates the EUV light and illuminates the mask 170. The illumination optical system 130 includes a collimating optical system (first optical unit) 131, a catoptric integrator 140, an aperture stop 150, an arc-shaping optical system (second optical unit) 153, a plane mirror 157, and a slit 158.

The collimating optical system 131 includes a concave mirror 133 and a convex mirror 136, and condenses and converts the EUV light that has passed the aperture 116 into collimated light CL. The collimated light CL of this embodiment allows the light that is slightly shifted from the perfectly parallel light. The EUV light passes the outer circumference of the convex mirror 136 so that the EUV light encompasses the convex mirror, is reflected on the concave mirror 133, then reflected on the convex mirror 136, and is incident as the collimated light CL upon the catoptric integrator 140. While the collimating optical system 131 of this embodiment is a Schwarzshild optical system, the present invention allows the convex mirror 136 to have an aperture through which the EUV light from the aperture 116 can pass.

Since this embodiment assumes that the plasma emission part EP is a point light source, a ray collimated by the collimating optical system 131 is a ray radiated from one point on the plasma emission point EP at various angles. In other words, the irradiation surface of the integrator illuminated by the collimating optical system 131 is not conjugate with the plasma emission part EP. However, a large plasma emission part EP allows the integrator's irradiation surface to be configured conjugate with the plasma emission part EP. In this case, the collimating optical system 131 collimates the rays radiated in the same direction from different heights of the plasma emission part EP.

The catoptric integrator 140 is a homogenizer that forms plural secondary light sources used to uniformly illuminate the mask 170 with the light from the collimating optical system 131. The catoptric integrator 140 has plural cylindrical reflection surfaces 144 having the same direction G of generatrix 145. More specifically, the catoptric integrator 140 of this embodiment includes first and second corrugated integrator parts 142A and 142B each having plural cylindrical reflection surfaces 144, and the first and second plane mirrors 148A and 148B.

The catoptric integrator 140 includes plural sets of the integrator part 142 and the plane mirror 148, and exhibits one function. Hereinafter, a pair of the first integrator part 142A and the first plane mirror 148A will be referred to as a first special integrator 141A. Similarly, a pair of the second integrator part 142B and the second plane mirror 148B will be referred to as a second special integrator 141B. The first and second special integrators 141A and 141B are arranged in parallel as shown in FIG. 3 so that their reflection surfaces oppose to each other. The first special integrator 141A is arranged closer to the light source section 110 along the optical path than the second special integrator 141B.

The first plane mirror 148A is arranged adjacent to the first integrator part 142A, and parallel to or the same plane as a plane formed by the plural generatricies 145 of the first integrator part 142A. The second plane mirror 148B is arranged adjacent to the second integrator part 142B, and parallel to or the same plane as a plane formed by the plural generatricies 145 of the second integrator part 142B. The first integrator part 142A and the second integrator part 142B are arranged at an incident side of the aperture stop 150 while their reflection surfaces are maintained opposite or parallel to each other. The first and second integrator parts 142A and 142B completely overlap each other with no shift when viewed from the direction perpendicular to them. The opposing first and second integrator parts 142A and 142B have the parallel cylindrical reflection surfaces 144.

The aperture stop 150 has an aperture 151 through which the light from the first and second integrator parts 142A and 142B can pass. The aperture stop 150 is arranged so that the aperture 151 can be perpendicular to the generatrix direction G or the reflection surfaces 144 near a boarder between the second integrator part 142B and the plane mirror 148B. The aperture stop 150 is optically conjugate with the pupil in the projection optical system 180, and has a Fourier transformation relationship with the mask plane.

The first plane mirror 148A is arranged at the incident side of the aperture stop 150, and the second plane mirror 148B is arranged at the exit side of the aperture stop 150. The light reflected on the first integrator part 142A passes the aperture 151 in the aperture stop 150, and enters the second plane mirror 148B, and the light reflected on the first plane mirror 148A is incident upon the second integrator 142B.

The arc-shaping optical system 153 condenses the light from the catoptric integrator 140 in an arc shape, and superposes the light from each secondary light source on the illumination surface (mask plane). The arc-shaping optical system 153 forms an arc illumination area suitable for the mask plane. The arc-shaping optical system 153 includes a convex mirror 154, a concave mirror 155, and a plane mirror 157. The plane mirror 157 does not have an arc shaping function but simply deflecting the image-side light of the arc-shaping optical system 153 toward the mask 170 at a predetermined angle.

The slit 158 has an arc aperture, and can change part of its width. The divergent light split by each cylindrical surface of the catoptric integrator 140 is condensed in an arc shape, and forms an arc illumination area having uniform illuminance in an aperture of the slit 158.

Figure 4A:
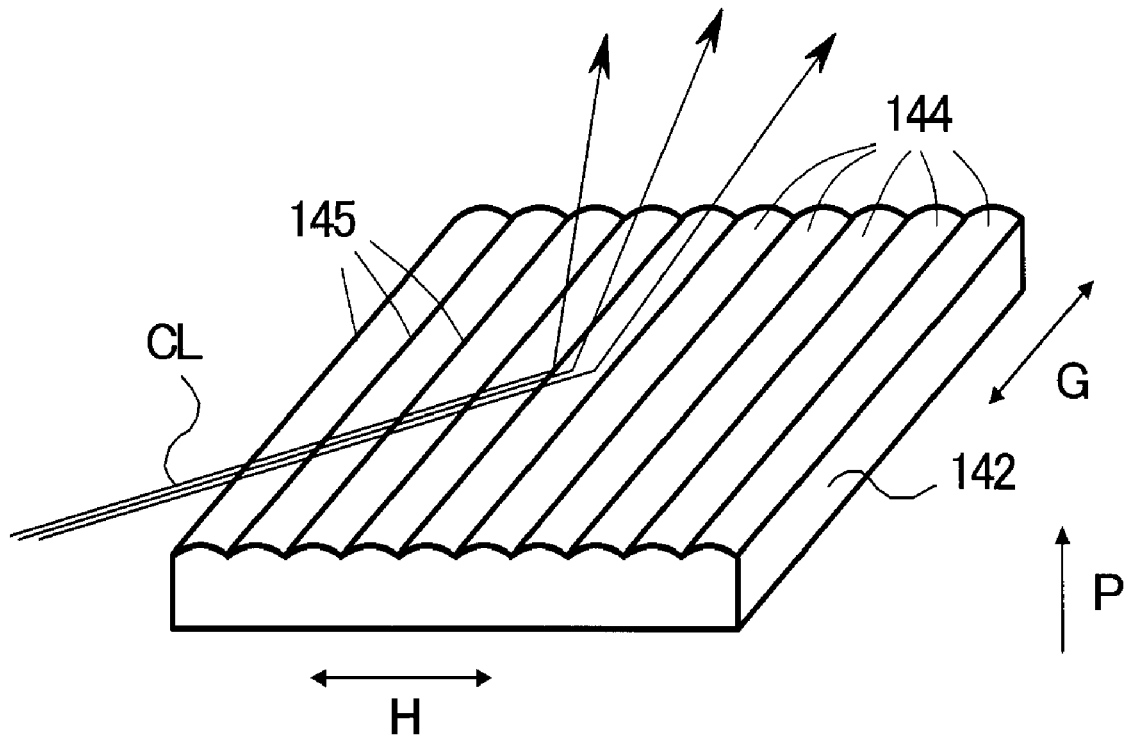
FIG. 4A is a schematic perspective view showing an incidence of collimated light upon integrator part having plural convex cylindrical reflection surfaces.
Figure 4B:
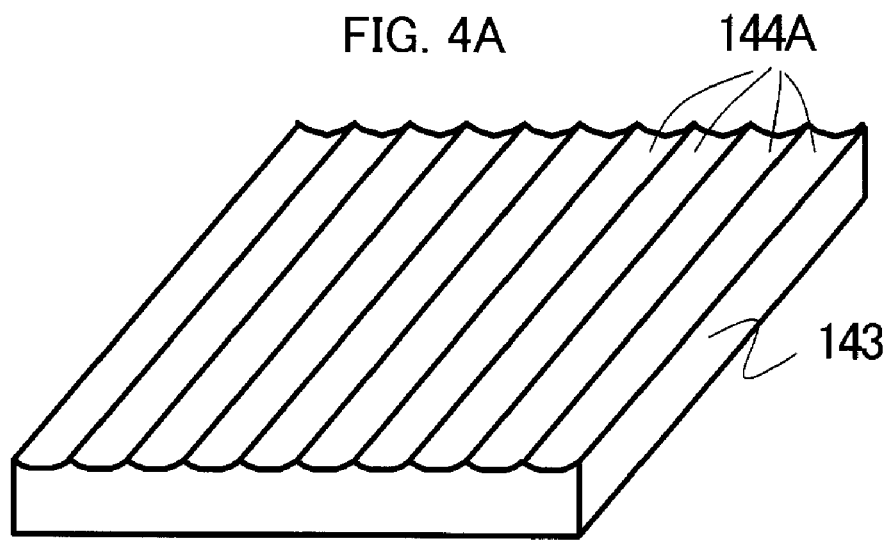
FIG. 4B is a schematic perspective view of an integrator part having plural concave cylindrical reflection surfaces having an effect similar to that in FIG. 4A.
Figure 5:
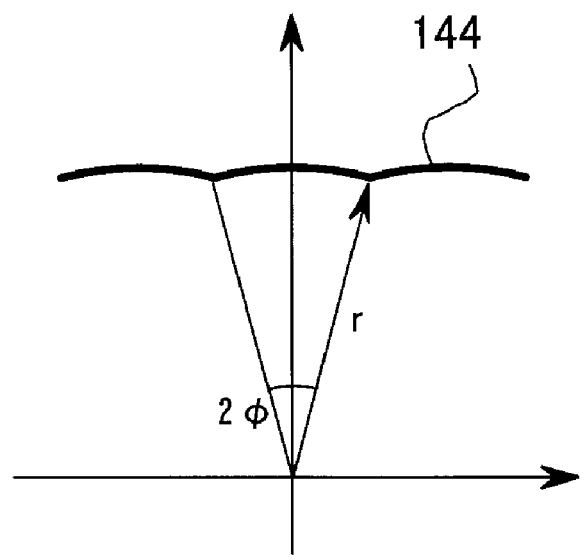
FIG. 5 is a schematic sectional view of the convex cylindrical reflection surface shown in FIG. 4A.
Figure 6:
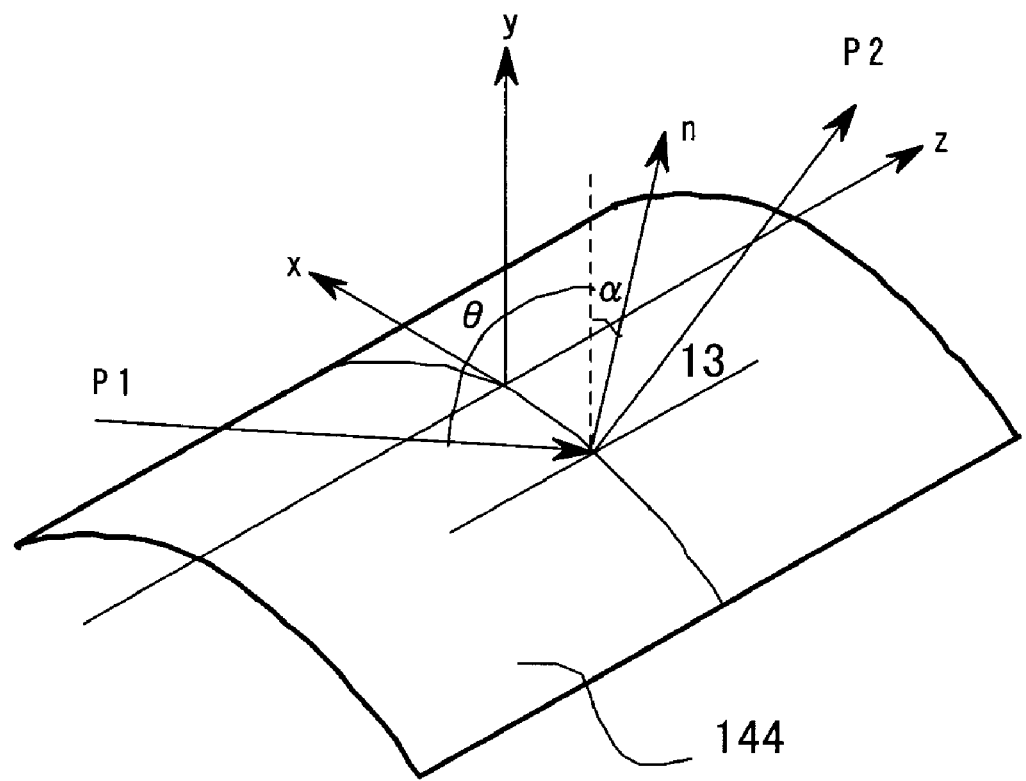
FIG. 6 is a schematic perspective view for explaining a reflection of the EUV light on the convex cylindrical reflection surface shown in FIG. 4A.
Figure 7:
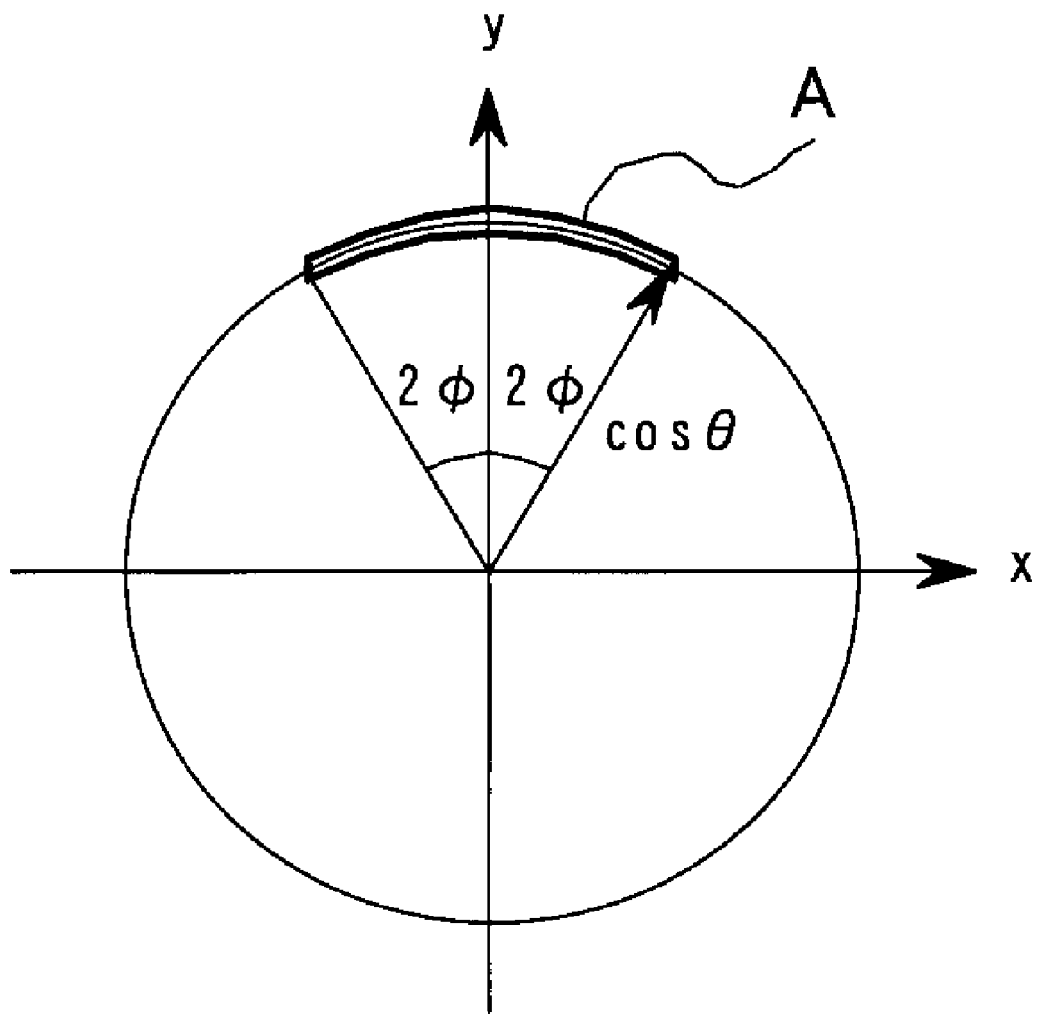
FIG. 7 shows an angular distribution of the EUV light reflected on the convex cylindrical reflection surface shown in FIG. 4A.

Referring now to FIGS. 4A to 7, a description will be given of a principle of uniform illuminations of the arc area by the catoptric integrator 140. Here, FIG. 4A is a schematic perspective view when the collimated light CL is incident upon the integrator part 142 having plural convex cylindrical reflection surfaces 144. FIG. 4B is a schematic perspective view of the integrator part 143 having plural concave cylindrical reflection surfaces having an effect similar to that in FIG. 4. The integrator parts 142A and 142B shown in FIG. 3 is the integrator part 142 shown in FIG. 4A, but may be replaced with the integrator part 143 shown in FIG. 4B. FIG. 5 is a schematic sectional view of the convex cylindrical reflection surfaces 144. FIG. 6 is a schematic perspective view for explaining a reflection of the EUV light on the convex cylindrical reflection surface 144. FIG. 7 shows an angular distribution of the EUV light reflected on the convex cylindrical reflection surface 144.

As shown in FIG. 4A, when the collimated light CL is incident upon the integrator part 142 having plural cylindrical reflection surfaces 144, linear secondary light sources are formed near the surface of the integrator part 142, and the secondary light sources radiate the EUV light with an angular distribution in a conical plane. Next, the EUV light is reflected on the mirror having a focal point at this secondary light source and illuminates the mask 170 or the plane conjugate with the mask 170, realizing the arc illumination.

Referring now to FIG. 6, a description will be given of a behavior of the reflected light when the collimated light CL is incident upon one cylindrical reflection surface 144 in order to explain an operation of the integrator part 142 having plural cylindrical reflection surfaces 144. Now, the collimated light CL is incident upon one cylindrical reflection surface 144 at an angle $\theta$ to a plane perpendicular to the center axis. A ray vector of the collimated light CL is defined as $P1=(0, -\cos\theta, \sin\theta)$, and a normal vector of the cylindrical reflection surface is defined as $n=(-\sin\alpha, \cos\alpha, 0)$. Then, a ray vector of the reflected light becomes $P2=(-\cos\theta\times\sin 2\alpha, \cos\theta\times\cos 2\alpha, \sin\theta)$.

The ray vector of the reflected light plotted in the phase space forms a circle having a radius of $\cos\theta$ on the xy plane, as shown in FIG. 6. Thus, the reflected light becomes divergent light having a conical plane, and the secondary light source exists near the vertex of the conical plane. The secondary light source exists as an external real image for the concave cylindrical reflection surface 144A, and an internal virtual image for the convex cylindrical reflection surface 144. In addition, when the reflection surface is limited to part of the cylindrical surface and its central angle is $2\phi$, as shown in FIG. 5, the ray vector P2 of the reflected light exists in an arc A having a central angle of $4\phi$ on the xy plane as shown in FIG. 7.

Now assume a rotational paraboloid mirror having a focal length f with a focal point at a position of the secondary light source formed when the collimated light CL is incident upon the cylindrical reflection surface, and an illumination surface that is distant by f from the mirror. The light emitted from the secondary light source becomes divergent light having a conical plane and then collimated light after reflected on the mirror having the focal length f. The reflected light becomes a sheet beam having an arc section, a radius of $f\times\cos\theta$, and a central angle $4\phi$. Therefore, as shown in FIG. 7, only the arc area A having a radius of $f\times\cos\theta$ and a central angle $4\phi$ is illuminated on the illumination surface.

Figure 8:
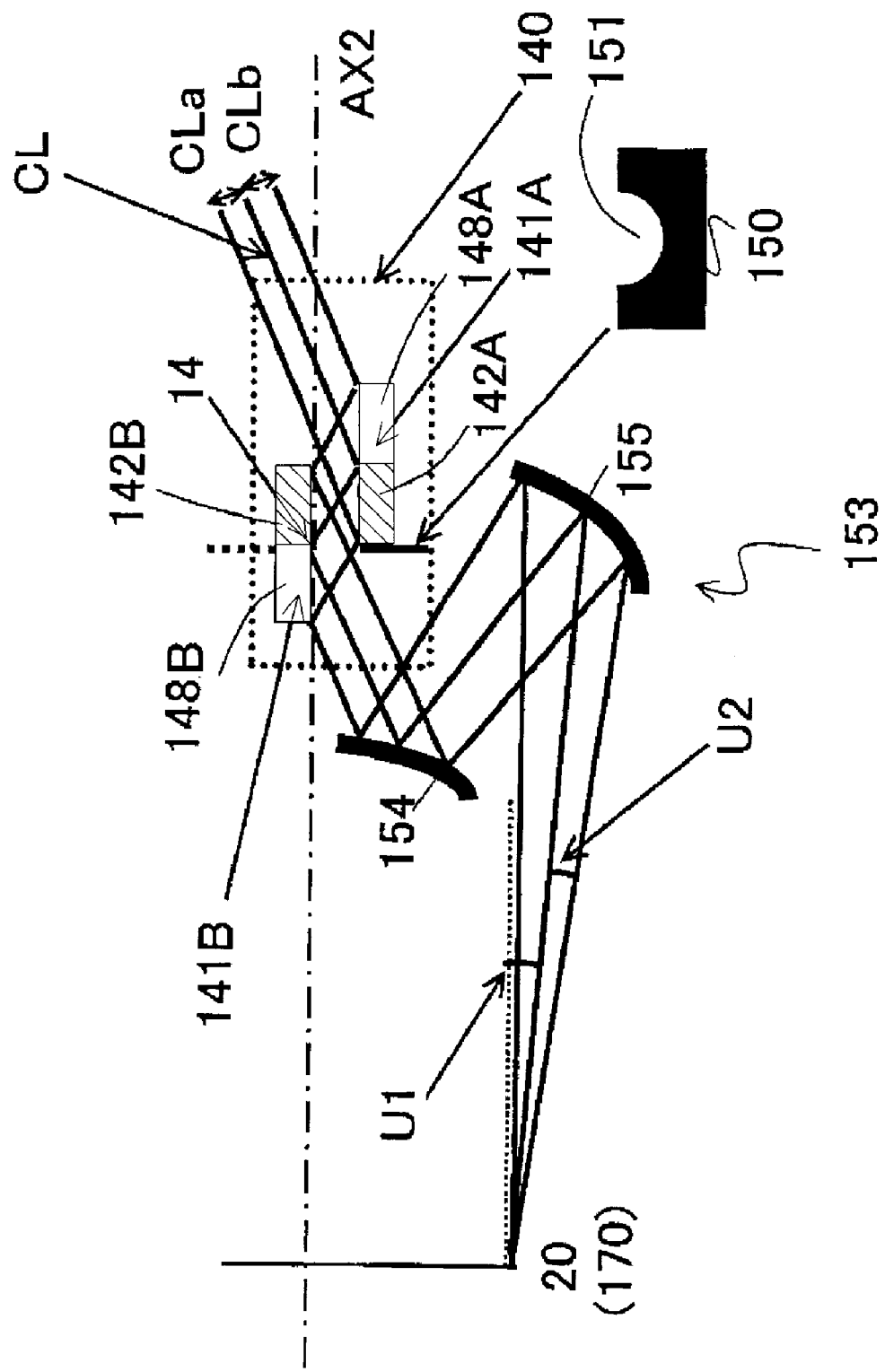
FIG. 8 is a schematic sectional view for explaining a behavior of the catoptric integrator shown in FIG. 3.

Referring now to FIG. 8, a description will be given of a behavior when the collimated light is incident upon the catoptric integrator 140 in a direction shown in FIG. 3. Here, FIG. 8 is a schematic sectional view of the catoptric integrator 140 upon which the collimated light CL is incident. In FIG. 8, 20 denotes an image plane (illumination surface), which is equivalent with a plane of the mask 170 (mask plane).

The arc-shaping optical system 153 is a coaxial system having an axis AX2 as a central symmetrical axis, and the center position 14 of the light irradiation area on the integrator part 142B and the image plane 20 are maintained to have an approximately Fourier transformation relationship. In other words, the position 14 serves as an approximately pupil plane of the image plane 20. The collimated light CL is incident upon the catoptric integrator 140, and condensed in an arc shape near the image plane 20.

The arc-shaping optical system 153 is configured non-telecentric at the image side, and an incident angle U1 upon the image plane 20 is set equal to an inclination angle of an object-side principal ray of the projection optical system 180. An interval between the rotationally symmetrical axis AX2 and the image-side principal ray inclines so that the interval narrows at a position closer to the image plane 20. For example, this embodiment sets the incident angle U1 to about 6°, and properly corrects blurs at the image side so as to set a spot diameter to 5 mm or smaller, preferably 1 mm or smaller.

The incident angle of the EUV light principal ray upon the mirrors 154 and 155 is set to a low incident angle, more specifically 20° or smaller. This configuration provides a smaller blur amount in condensing the light upon the image plane 20 and results in a higher condensing efficiency upon the arc illumination area than an arrangement with a high incident angle using the rotational paraboloid mirror, etc. In addition, this configuration reduces the light loss due to shielding at the slit 158, and improves the illumination efficiency.

An arc orientation of the arc illumination area inverts when the plane mirror 157 deflects and reflects the image-side light towards the mask 170. In this case, the center of the arc is set to an intersection between the central axis (optical axis) AX3 of the projection optical system 180 and the mask plane. Due to the incident angle U1, image-side principal ray IL of the arc-shaping optical system 153 accords with the principal ray of image-side light OL of the projection optical system 180 with respect to the mask 170 as a reflection plane.

The angular distribution of the light reflected on a mirror that arranges multiple cylindrical reflection surfaces 144 in parallel is similar to that with a single cylindrical reflection surface. The light incident upon one point of the image plane 20 derives from the entire illumination area of the mirror that arranges multiple cylindrical reflection surfaces 144 in parallel. The collimated light CL's angular spread (or condensing NA) becomes $U2=\gamma=D/f$, where D is a luminous flux's diameter, and f is a focal length of the arc-shaping optical system. In the arc illumination area, respective luminous fluxes from multiple cylindrical reflection surfaces 144 are superposed in a direction along the arc to achieve the illuminance uniformity, thereby providing an efficient and uniform arc illumination.

Figure 9:
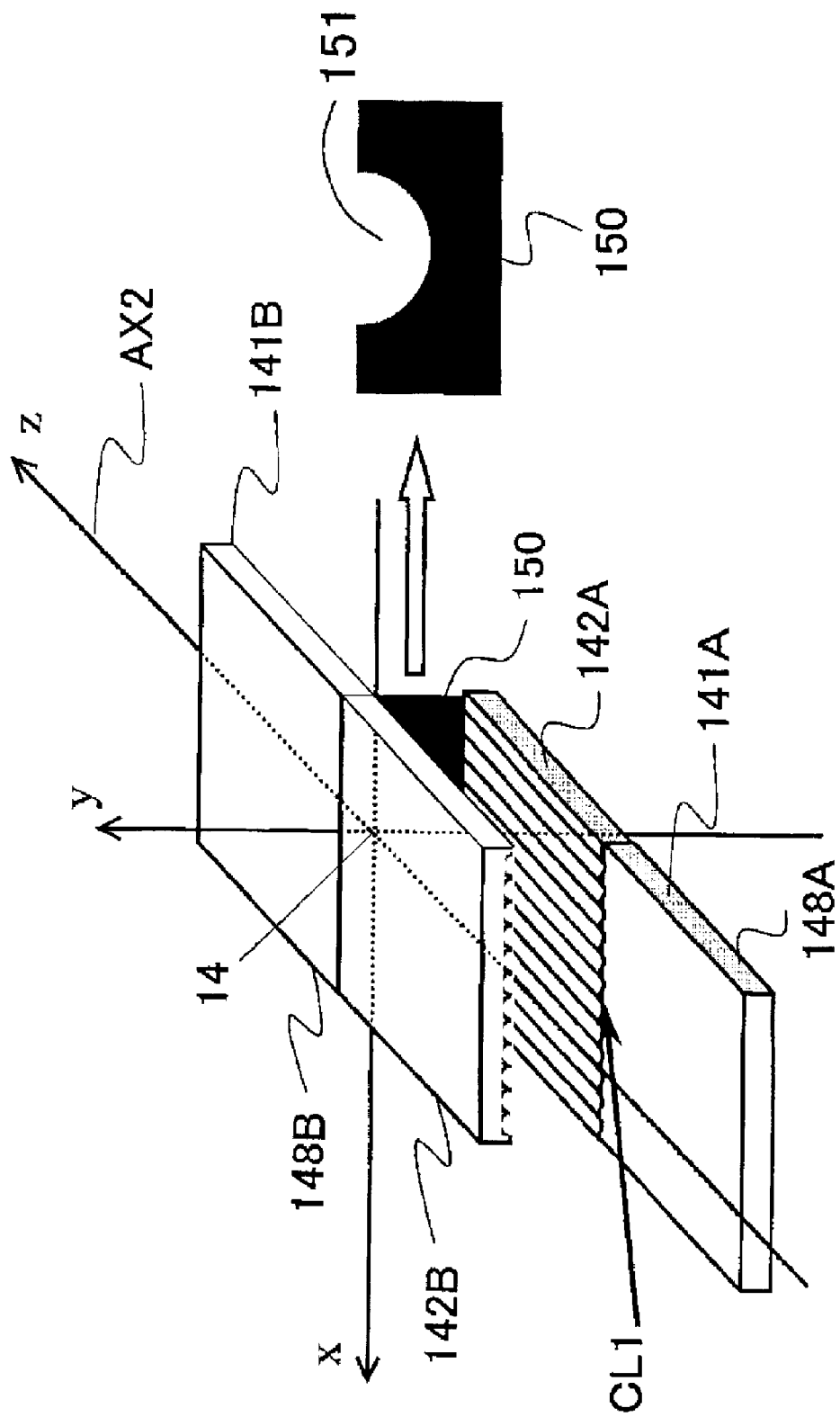
FIG. 9 is a schematic perspective view showing an arrangement between the aperture stop and the catoptric integrator shown in FIG. 3.

Referring now to FIGS. 8 and 9, a detailed description will be given of the aperture stop 150 and the special integrators 141A and 141B. FIG. 9 is a schematic perspective view of an arrangement among the aperture stop 150 and the special integrators 141A and 141B. In FIG. 9, CL1 denotes a direction of the central principal ray of the collimated light CL incident upon the catoptric integrator 140, and passes a vicinity of a border between the integrator part 142A of the special integrator 141A and the plane mirror 148A on an approximately yz section. The position 14 is an approximately center of the pupil plane of the arc-shaping optical system 153, as described above. While the xyz coordinate is described with an origin at the position 14, the z axis approximately accords with the axis AX2 of the arc-shaping optical system 153.

The aperture 151 of the aperture stop 150 is arranged perpendicular to and near a boarder between the integrator part 142B of the special integrator 141B and the plane mirror 148B. The aperture stop 150 provides a circular effective light source shape, but the aperture 151 is characteristically semicircle. When the aperture stop 150 is switched, a change of the coherence factor c and a modified illumination, such as an annular illumination, is available. A description will be given of a method of a modified illumination. The modified illumination arranges an aperture stop having an aperture that corresponds to half a shape divided by the lateral symmetrical axis of the effective light source distribution.

Figure 11A:
FIGS. 11A-11D show plane views of various aperture stops applicable to the aperture stop shown in FIG. 1.
Figure 11B:
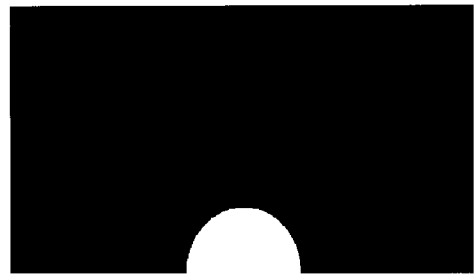
Figure 11C:
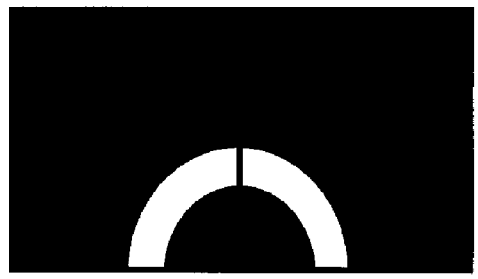
Figure 11D:
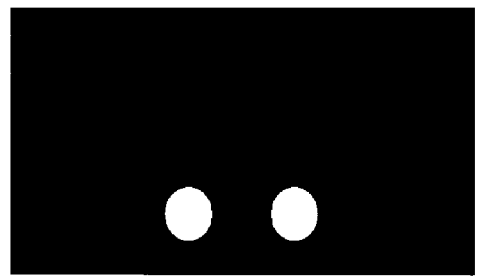

As discussed above, the aperture stop 150 and the pupil plane of the projection optical system 180 have a conjugate relationship, and a shape of the aperture 151 or a light transmission pattern corresponds to an effective light source distribution on the pupil plane in the projection optical system 180. FIGS. 11A to 11D are plane views showing shapes applicable to the aperture 151. FIG. 11A shows a usual illumination mode with a large σ, FIG. 11B shows a usual illumination mode with a small σ, FIG. 11C shows an annular illumination mode, and FIG. 11D shows a quadrupole illumination mode. Any aperture stop can provide a shape of an aperture stop used for a dioptric system when folded with respect to the bottom line. A desired aperture shape can be formed when a drive system (not shown) switches among plural types of aperture stops.

This embodiment arranges the aperture stop 150 perpendicular to the reflection surface of the catoptric integrator 140, but the aperture stop 150 may be slightly inclined by about 1° to 2° relative to a direction perpendicular to the reflection surface. The instant application also refers to such a slight inclination relative to the perpendicular as a "perpendicular to the generatrix direction of the cylindrical reflection surface." In addition, in order to adjust the effective light source distribution, the telecentricity, etc., a drive mechanism (not shown) configured to adjust an angle relative to the cylindrical reflection surface of the aperture stop 150 may be provided near the aperture stop 150.

Referring now to FIG. 8, a description will be given of light shielding by the aperture stop 150. The collimated light CL is incident upon the reflection surface of the special integrator 141A at a relatively high incident angle, such as 70°. An upper side CLa of the collimated light CL illuminates the integrator part 142A, and generates the divergent light due to the secondary light source. The semicircular aperture 151 in the aperture stop 150 arranged just behind it shields part of the divergent light. On the other hand, a lower side CLb of the incident collimated light CL is deflected by the plane mirror 148A, and illuminates the integrator part 142B. After the secondary light source generates the divergent light, the semicircular aperture 151 in the aperture stop 150 arranged just behind it shields part of the divergent light. Thus, the aperture stop 150 having the semicircular aperture 151 behaves as if it has a circular aperture to the subsequent arc-shaping optical system 153.

Figure 10A:
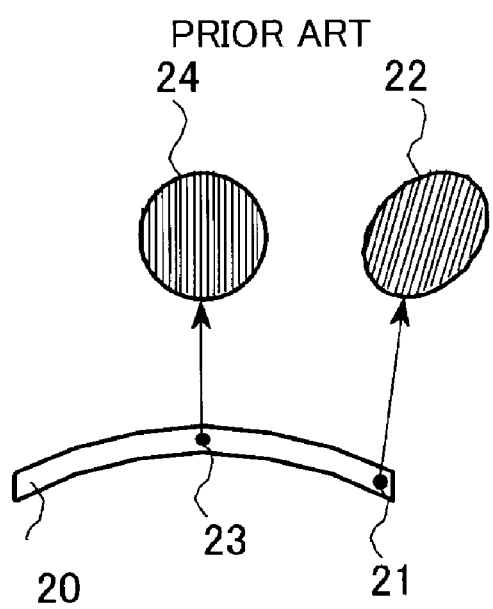
FIG. 10A is a schematic plane view of an effective light source distribution obtained from a conventional relationship between the integrator and aperture stop.
Figure 10B:
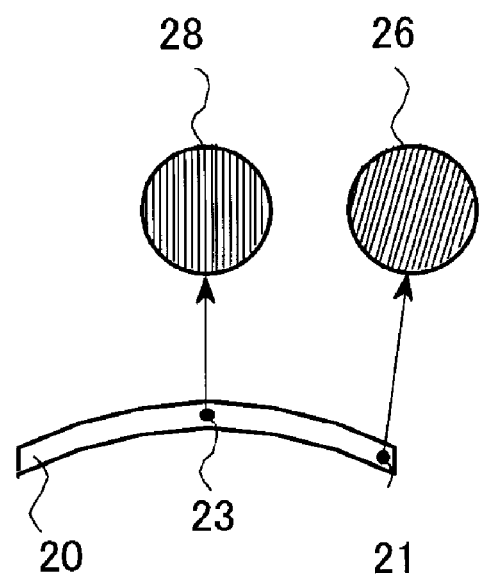
FIG. 10B is a schematic plane view of an effective light source distribution obtained from a relationship of this embodiment between the integrator and the aperture stop.

As shown in FIG. 9, the aperture stop 150 is arranged near a border between the integrator part 142B and the plane mirror 148B. Different from JP 2005-141158, the whole collimated light CL is incident upon the integrator parts 142A and 142B, and then passes the aperture stop 150. As a result, the effective light source distribution (which is a light source image on the pupil plane in the projection optical system) becomes circular at an arbitrary position in the arc illumination area. FIGS. 10A and 10B show this state. In these figures, 21 and 23 denote an end and central part of the arc, respectively. 22 denotes an effective light source distribution at the end 21, and 24 is an effective light source distribution at the central part 23.

FIG. 10A shows shapes of the effective light sources 22 and 24 with no aperture stop 150, and the effective light source 22 has a shape similar to the effective light source 22 shown in FIG. 2. The effective light source 24 has a shape of a regular circle at the central part 23 of the arc area. Since the distribution distorts due to lack of the aperture stop 150 as a position separates from the central part 23, and an elliptical effective light source 22 is formed at the end 21. The effective light source distribution at an arbitrary point in the illumination area shows an angular distribution of the light incident in a conical shape with an NA at that point. When that is asymmetric like the effective light source 22, the exposure NA becomes asymmetrical and deteriorates the resolving characteristic.

On the other hand, FIG. 10B shows shapes of the effective light sources 26 and 28 when the aperture stop 150 is arranged. Each of the effective light sources 26 and 28 has a shape of a regular circle at both the end 21 and the central part 23, achieving a uniform exposure NA.

The bevel shown in each of the effective light sources 22 to 28 shows that the secondary light source that is generated by the integrator pars 142A and 142B linearly distributes. An interval of lines depends upon a width of the cylindrical reflection surface 144 of each of the integrator parts 142A and 142B. As the width of the cylindrical reflection surface 144 narrows and the number of cylindrical reflection surfaces increases, the line interval becomes narrower and the effective light source distribution becomes finer.

The special integrators 141A and 141B are those types which integrate the integrator part and the plane mirror, but the integrator part and the plane mirror may be separate and independent and they may have an independent adjusting mechanism.

The integrator parts 142A and 142B are arranged at the incident side of the aperture stop 150 so that they receive part of the light from the collimating optical system 131 and respective cylindrical reflection surfaces 144 oppose to a direction P that is perpendicular to the generatrix direction G and the arrangement direction H of the cylindrical reflection surfaces 14. This embodiment allows all luminous fluxes to pass the aperture stop 150 after they irradiate the integrator parts 142A and 142B, and restrains a distortion of the effective light source distribution that would occur in the prior art. The conceivably simplest structure is a structure that arranges the aperture stop having a circular aperture after one integrator shown in FIG. 12.

Figure 12:
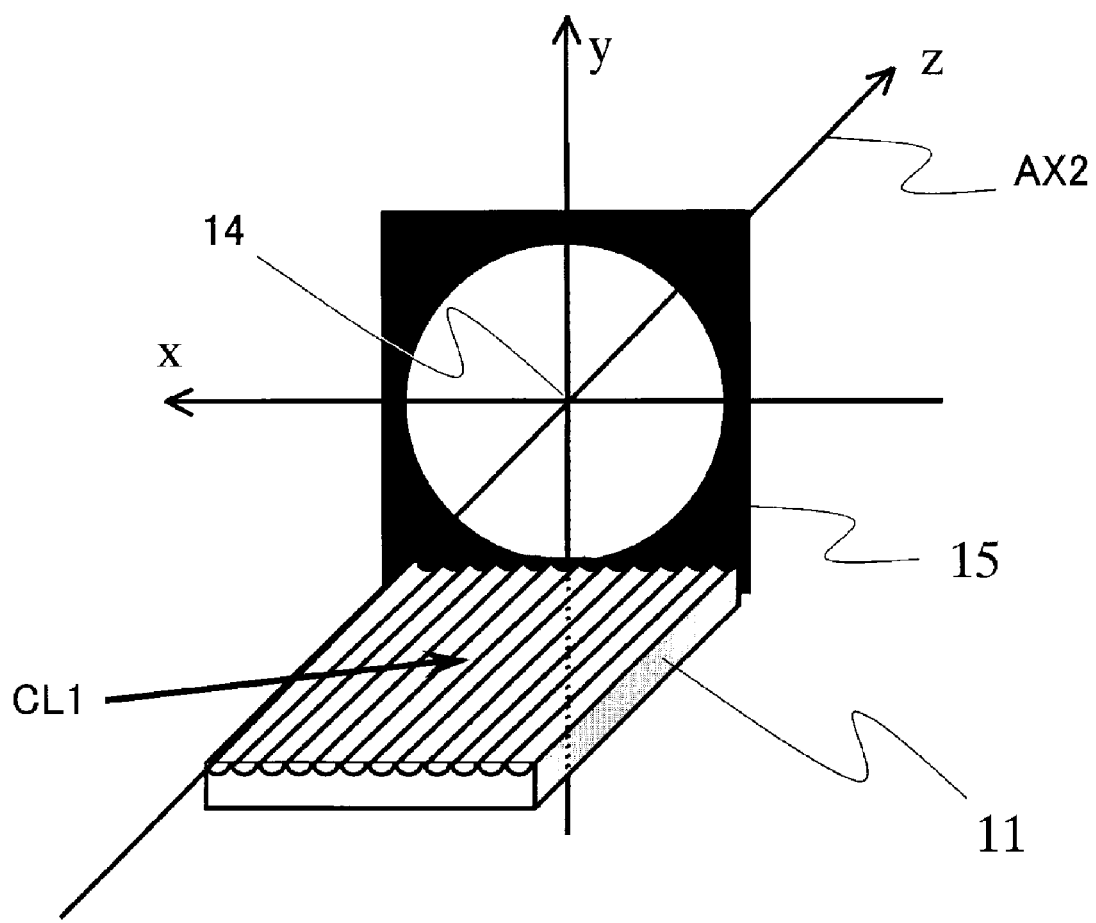
FIG. 12 is a schematic perspective view of one integrator part and a circular aperture stop.
Figure 13:
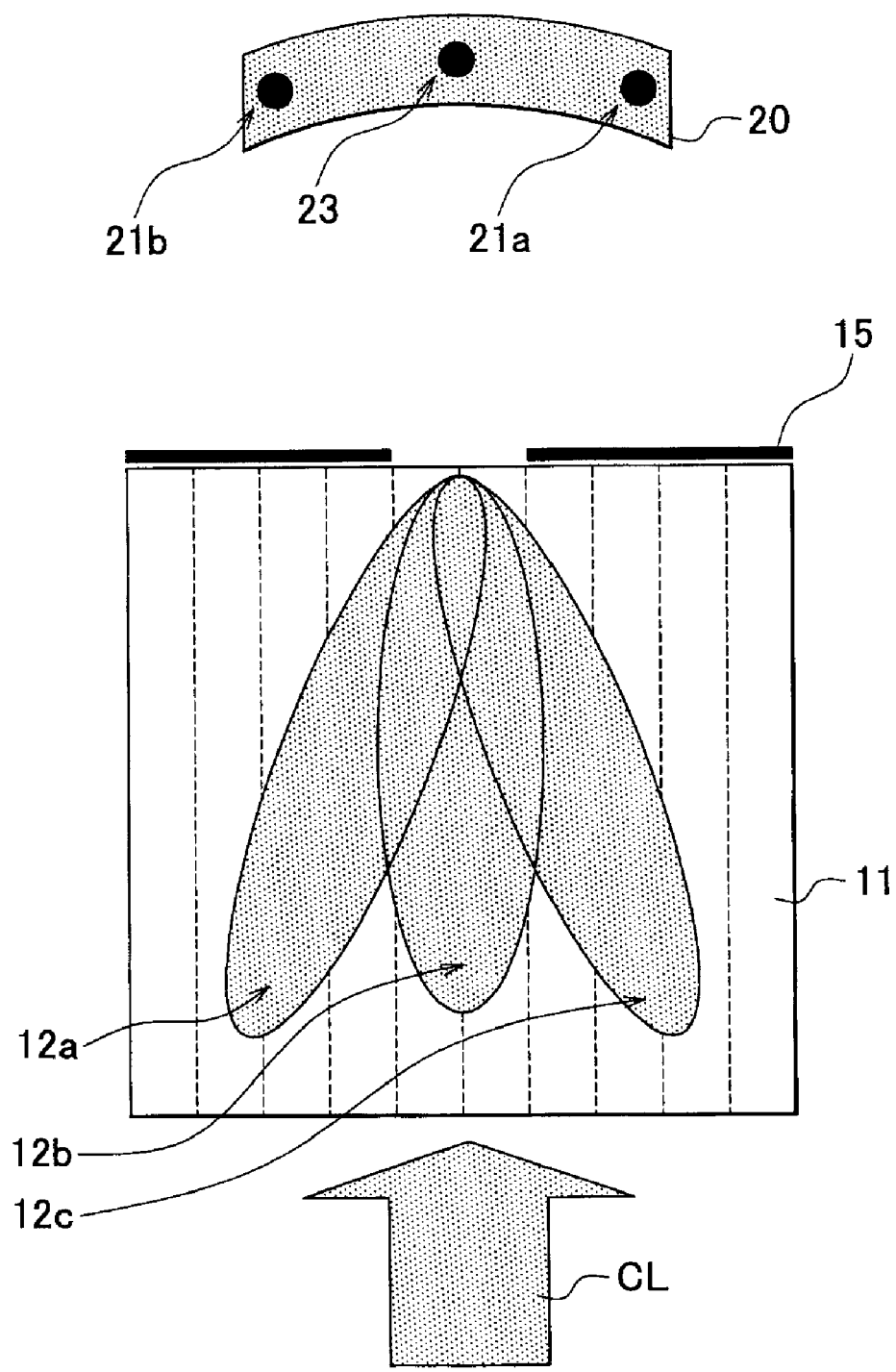
FIG. 13 is a schematic plane view for explaining a problem of a structure shown in FIG. 12.

Referring now to FIGS. 13 to 14C, a description will be given of a problem of a structure shown in FIG. 12. Here, FIG. 13 is a schematic plane view of the reflection surface of the integrator 11 when the reflection surface is viewed from a direction perpendicular to the reflection surface, and omits an imaging optical system between the integrator 11 and the image plane 20 having an arc area for simplicity purpose. The collimated light C1 is incident from a shown direction, and irradiates the integrator 11. 12a, 12b, and 12c are areas to be irradiated by collimated light necessary for the effective light source having a shape of a regular circle at respective parts 21a, 23 and 21b. The areas 12a to 12c radially extend around the stop 15.

Figure 14B:
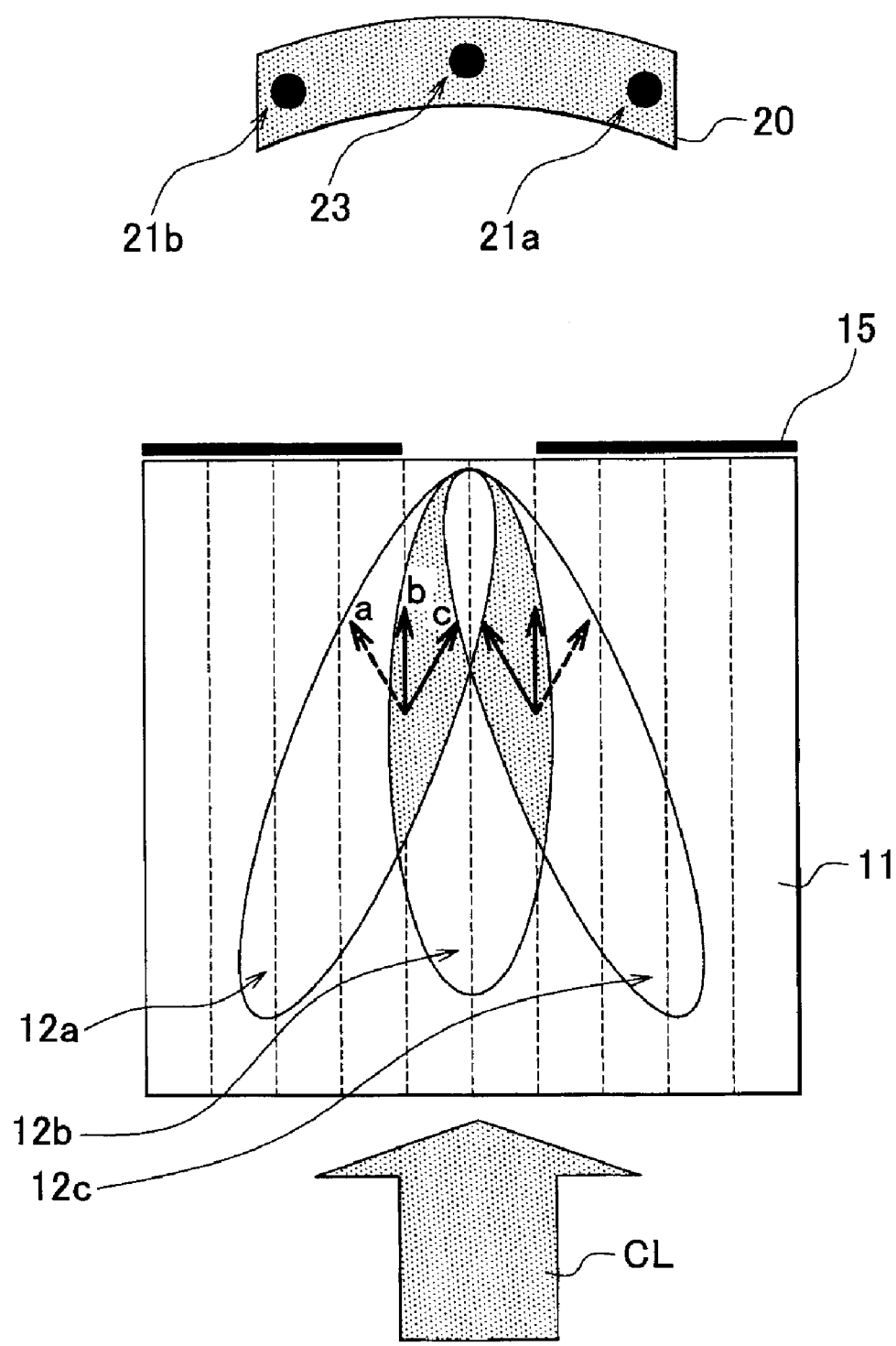

FIGS. 14A to 14C are schematic plane views of overlaps among the areas 12a to 12c. In these figures, arrows denote three divergent luminous fluxes that occur after the collimated light CL irradiates the integrator 11. A representative set is indicated by the divergent luminous fluxes a, b and c. A solid-line arrow denotes a luminous flux for illuminating the mask 170, and a dotted-line arrow denotes a luminous flux that is shielded by the stop 15 and does not contribute to an illumination of the mask 170.

FIG. 14A shows an overlapping area among three areas 12a to 12c near the stop 15. This area contributes to a shape of the effective light source at respective parts 21a, 21b, and 21c, and the divergent luminous fluxes a, b and c that are generated after the collimated light CL irradiates these areas are efficiently used. On the other hand, as shown in FIG. 14B, in the overlapping area between two areas that is slightly distant from the stop 15, the divergent luminous fluxes b and c contribute to the mask illumination, but the divergent luminous flux a is shielded by the stop and does not contribute to the illumination. As shown in FIG. 14C, in an area more distant from the stop 15, only the divergent light c contributes to an illumination of the mask 170, and most of divergent light is shielded by the stop 15 and cannot efficiently illuminate the mask 170.

On the other hand, this embodiment shortens a length of each integrator part, thereby a distance between the stop and the integrator, as shown in FIG. 15, providing an efficient illumination with an arc area. Here, FIG. 15 is a schematic plane view for explaining an effect of an arrangement of this embodiment. Since the integrator parts 142A and 142B oppose to and overlap each other in a direction perpendicular to the cylindrical reflection surface, FIG. 15 shifts integrator parts 142A and 142B from each other.

Turning back again to FIG. 3, the mask 170 is a reflection mask, on which a circuit pattern (or image) to be transferred is formed. The pattern is formed on a multilayer mirror by a nonreflecting part made of a EUV absorber. The mask 170 is attached to a mask stage 174 via a chuck 172, and driven in an arrow direction by the mask stage 174.

Figure 16:
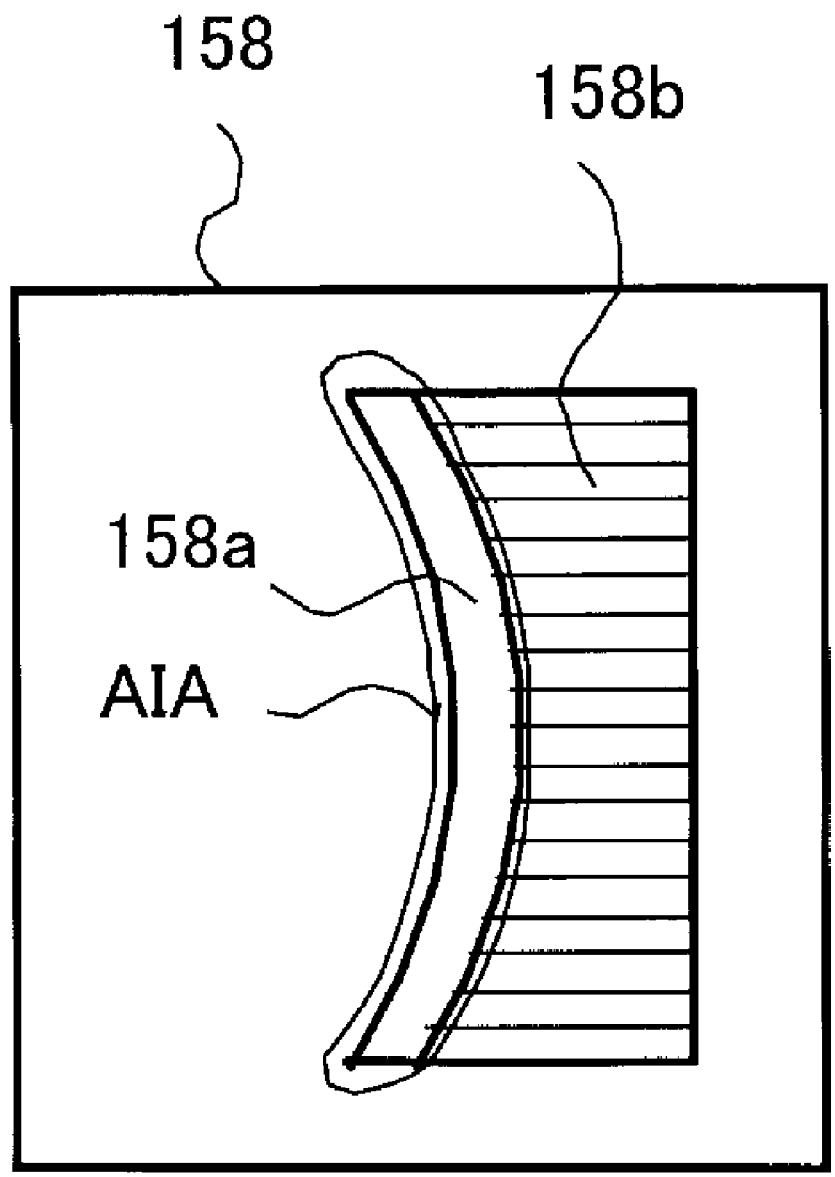
FIG. 16 is a schematic plane view of a slit shown in FIG. 3.

The mask 170 is arc-illuminated by the arc illumination area that is formed by the aperture of the slit 158. A center of curvature of the arc illumination area accords with the central axis AX3 of the projection optical system 180. As shown in FIG. 16, the slit 158 includes an arc aperture 158a, and a movable part 158b that can adjust part of a width of the aperture 158a. Here FIG. 16 is a schematic plane view of the slit 158. In FIG. 16, AIA denotes an arc illumination area formed by the catoptric integrator 140 and the arc-shaping optical system 153. The illumination area AIA and the aperture 158a determine the illumination area on the mask 170.

In scanning exposure, when the aperture 158a causes uneven luminance, the exposure unevenness occurs. In order to solve this problem, a slit width of a portion corresponding to strong luminance in the aperture 158a is made narrower via the movable part 158b to reduce the dose. This configuration makes uniform an accumulated exposure dose on the entire exposure area for exposure. During the scanning exposure, the slit 158 is kept stationary to the projection optical system.

The diffracted light generated from the mask 170 is reflected by the projection optical system 180, and projected onto the plate 190. The mask 170 and the plate 190 are arranged optically conjugate with each other. Since the exposure apparatus 100 of this embodiment is a scanner, the mask 170 and the plate 190 are scanned at a speed ratio corresponding to a reduction ratio in transferring the mask pattern onto the plate 190.

The projection optical system 180 includes plural (typically four to six) multilayer mirrors, and is designed so that a thin arc area that is off-axis with respect to the central axis AX3 can possess a good imaging characteristic. The projection optical system 180 projects a reduced size of a mask pattern onto the plate 190. The projection optical system 180 is configured non-telecentric so as to avoid physical interference with the illumination light incident upon the mask 170. For example, this embodiment inclines the object-side principal ray by about 6° relative to the normal direction of the mask 170. The projection optical system 180 is designed so that a thin arc area that is off-axis with respect to the center of the axis AX2 can possess a good imaging characteristic.

The plate 190 is a substrate, such as a wafer and a liquid crystal substrate, and a photoresist is applied to its surface. A plate stage 194 can support the plate 190 via a chuck 192, and move the plate 190 in the XYZ directions using a linear motor. The mask 170 and the plate 190 are synchronously scanned, and positions of the plate stage 194 and the mask stage 174 are monitored by a measurement instrument, such as a laser interferometer.

Second Embodiment

Figure 17:
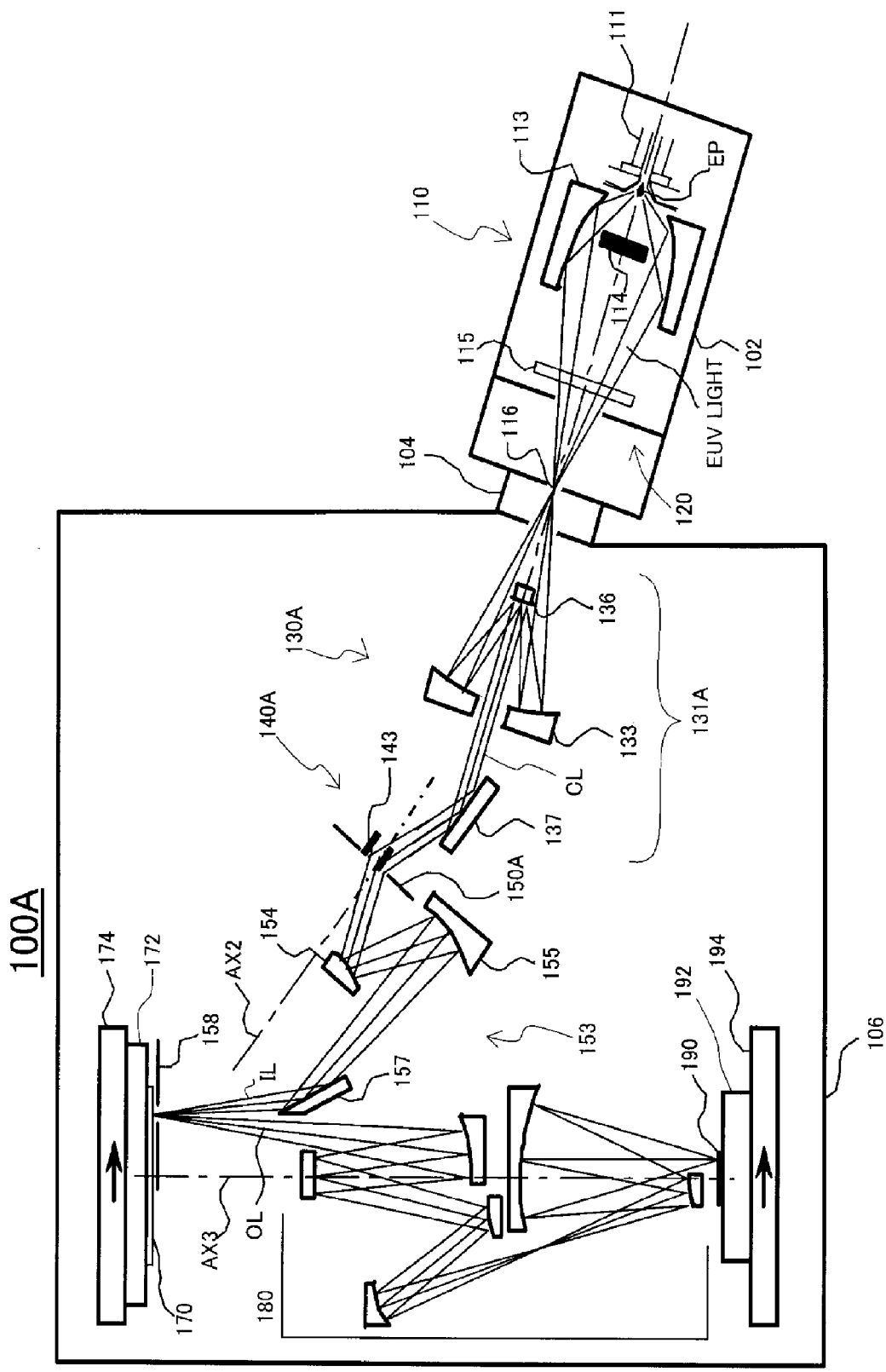
FIG. 17 is a schematic sectional view showing a structure of an exposure apparatus according to a second embodiment of the present invention.

Referring now to FIG. 17, a description will be given of an exposure apparatus 100A according to a second embodiment of the present invention. Here, FIG. 17 is a schematic structural view of the exposure apparatus 100A. The exposure apparatus 100A has a structure similar to that of the exposure apparatus 100 except for a collimating optical system 131A, a catoptric integrator 140A, and an aperture stop 150A in the illumination optical system 130A.

The collimating optical system 131A deflects the collimated light CL by adding a plane mirror 137 to the collimating optical system 131.

The catoptric integrator 140A includes two corrugated integrator parts 143 each having plural cylindrical reflection surfaces 144A at the incident side of the aperture stop 150A. The two integrator parts 143 are arranged in a direction perpendicular to the generatrix direction G and to an arrangement direction H of the cylindrical reflection surface 144A. In addition, two integrators 143 are arranged so that their cylindrical reflection surfaces 144 are arranged in parallel in the same direction. When the integrator part 143 is arranged before the aperture stop 150A, the collimated light CL from the collimating optical system 131A forms the secondary light source via the integrator part 143 and its radiation light limits the aperture stop 150A, similar to the first embodiment. This configuration consequently eliminates a distortion of the effective light source, and provides proper illuminations. In addition, similar to the first embodiment, use of plural integrator parts 143 shortens a distance between the aperture stop and the integrator part, efficiently providing an arc illumination area. This embodiment maintains the area to be illuminated by the parallel light similar to FIG. 15 so that the effective light source cannot be distorted when viewed from the direction perpendicular to the reflection surface of the integrator part 143.

Figure 18:
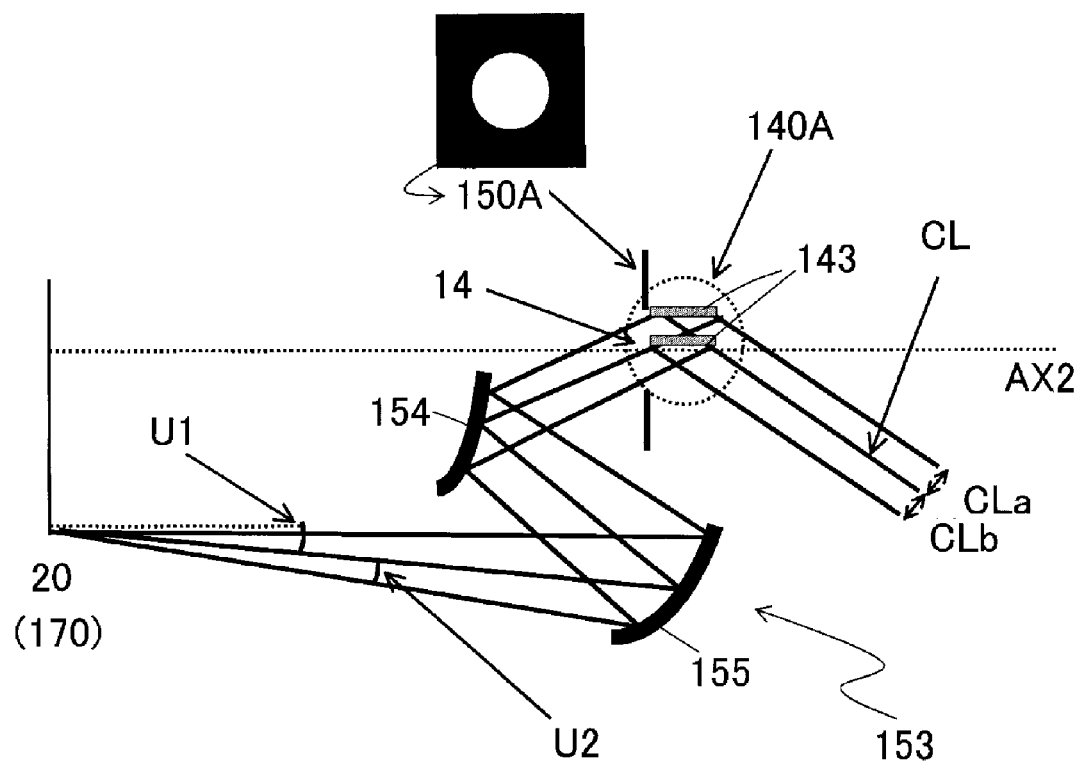
FIG. 18 is a schematic sectional view for explaining a behavior of a catoptric integrator shown in FIG. 17.
Figure 19A:
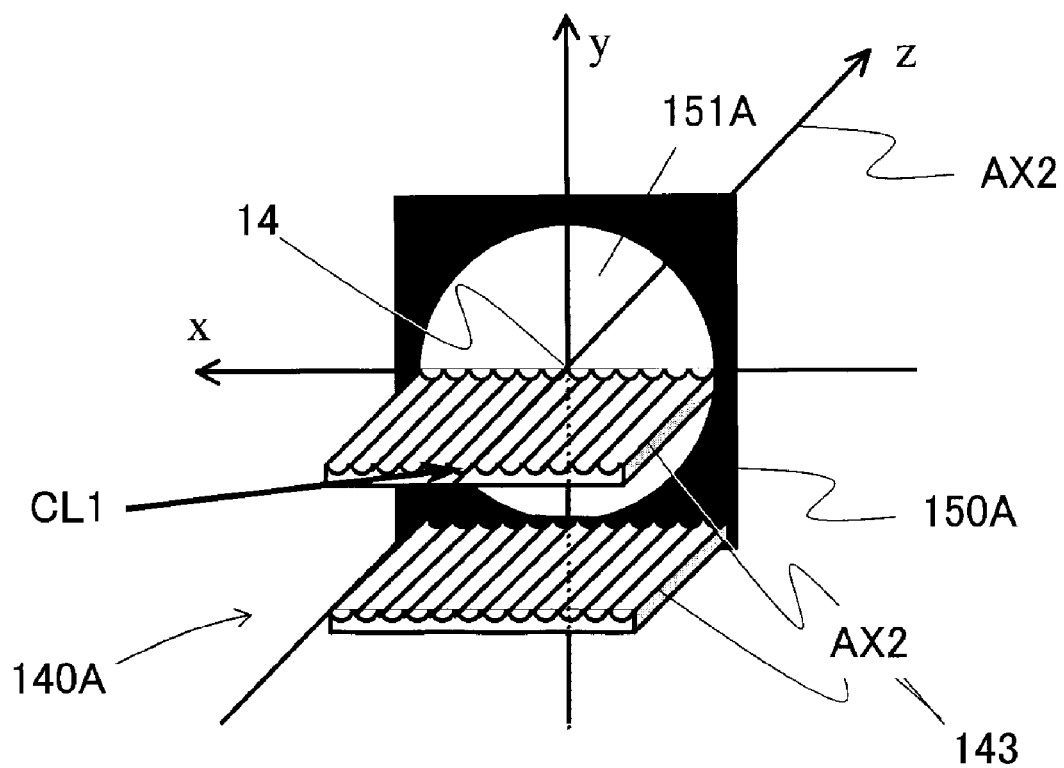
FIG. 19A is a schematic perspective view of an arrangement between the aperture stop and the catoptric integrator shown in FIG. 3.
Figure 19B:
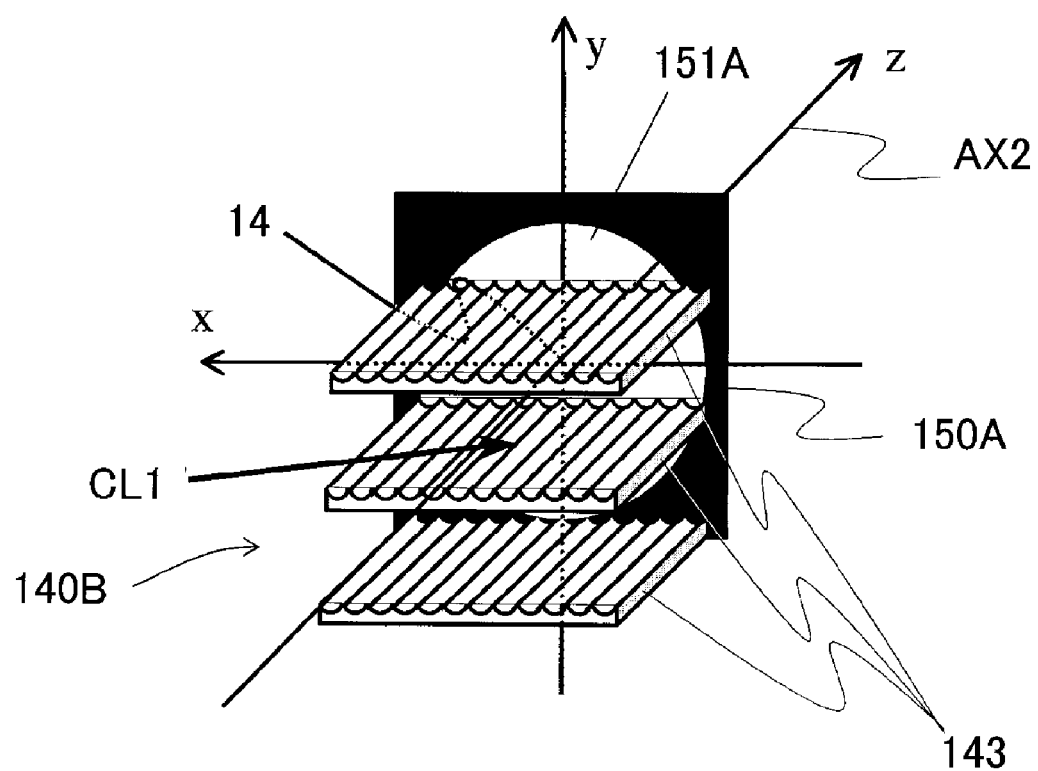
FIG. 19B shows a variation of the structure shown in FIG. 19A.

FIGS. 17, 18, and 19A show the catoptric integrator 140A having two integrator parts 143. Here, FIG. 18 is a schematic sectional view of the catoptric integrator 140A upon which the collimated light CL is incident. FIG. 19A is a schematic perspective view of an arrangement of the aperture stop 150A and two integrator parts 143, although three or more integrator parts 143 may be provided instead. FIG. 19B is a schematic perspective view of the catoptric integrator 140B having three integrator parts 143. The catoptric integrator 140A may be replaced with the catoptric integrator 140B.

In FIG. 18, 20 denotes an image plane (illumination surface), which is equivalent with the plane of the mask 170 (mask plane). The arc-shaping optical system 153 is a coaxial system having an axis AX2 as a central symmetrical axis, and the center position 14 of the aperture stop 150A and the image plane 20 are maintained to form an approximately Fourier transformation relationship. In other words, the position 14 is an approximately pupil plane of the image plane 20. The collimated light CL is incident upon the catoptric integrator 140A, and condensed in an arc shape near the image plane 20. The arc-shaping optical system 153 is similar to that shown in FIG. 8.

In FIGS. 19A and 19B, CL1 denotes a direction of a central principal ray of the collimated light CL incident upon the integrator part 143, and passes the yz section. The position 14 is an approximately center of the pupil plane of the arc-shaping optical system 153. The xyz coordinate sets an origin to the position 14, and the z axis accords with the axis AX2 of the arc-shaping optical system 153.

Figure 21A:
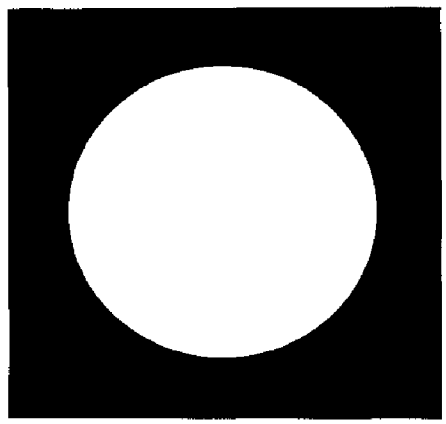
FIGS. 21A to 21D are plane views showing various aperture stops applicable to the aperture stop shown in FIG. 17.
Figure 21B:
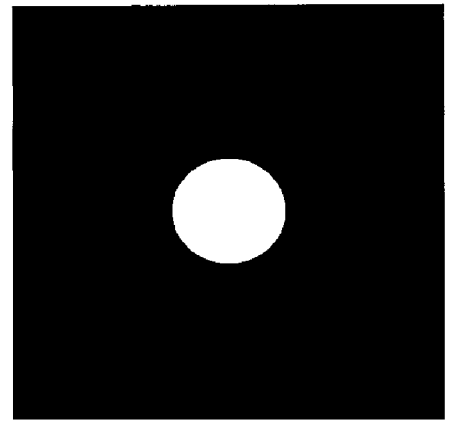
Figure 21C:
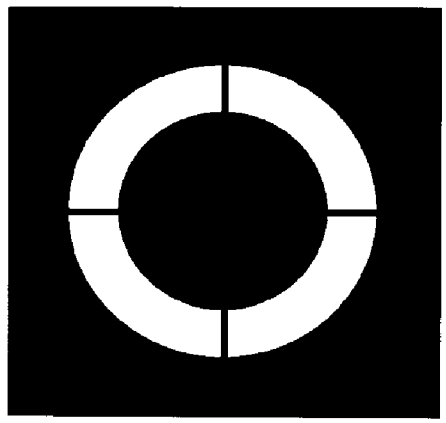
Figure 21D:
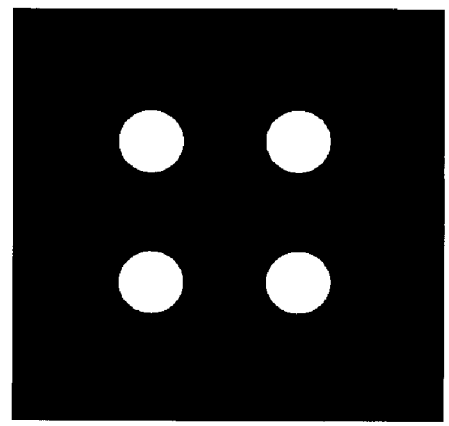

The aperture stop 150A includes an aperture 151A that allows the light from the integrator 143 to pass through it. The aperture 151A in the aperture stop 150A is arranged perpendicular to the cylindrical reflection surface 144a of two or more integrator parts 143 that are arranged in parallel in the y-axis direction. Moreover, as shown in FIGS. 19A and 19B, irrespective of the number of integrator parts 143, the cylindrical reflection surface 144A in the integrator part 143 arranged most distant from the z axis approximately contacts the circle of the aperture 151A. The aperture 151A is an aperture of the standard illumination mode. Therefore, unlike the first embodiment, a rotationally symmetrical aperture stop shown in FIG. 21 is used for the modified illumination. FIG. 21A shows a usual illumination mode with a large σ, FIG. 21B shows a usual illumination mode with a small σ, FIG. 21C shows an annular illumination mode, and FIG. 21D shows a quadrupole illumination mode.

Figure 20A:
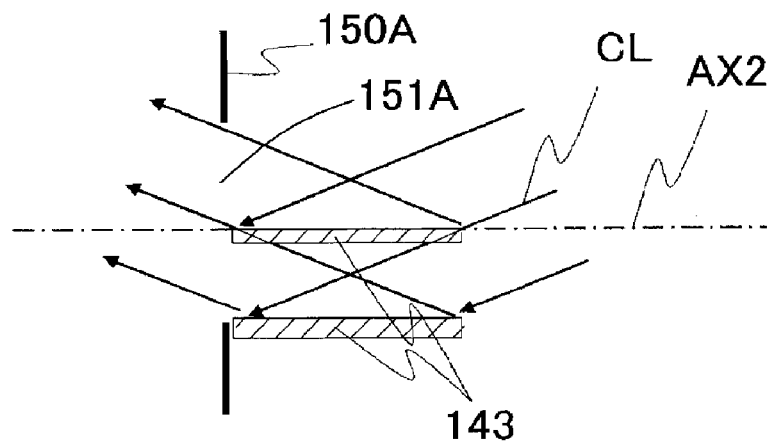
FIGS. 20A to 20C are schematic sectional views for explaining an optical operation of the structure shown in FIGS. 19A and 19B.
Figure 20B:
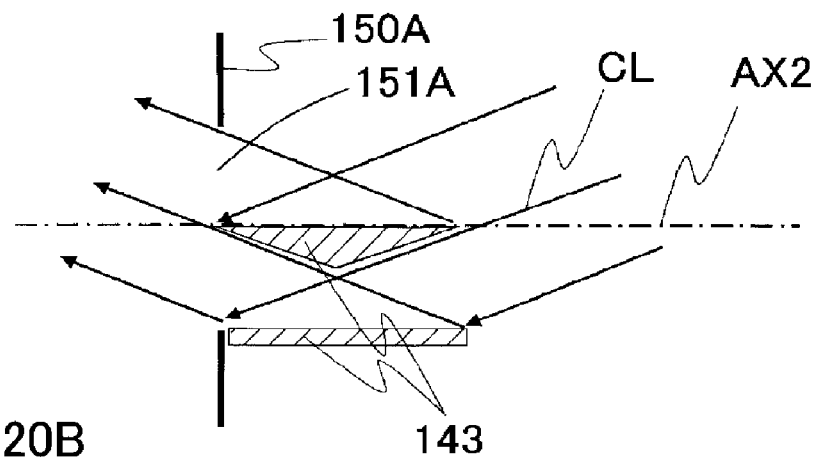

Referring now to FIGS. 20A and 20B, a description will be given of an optical operation of the two integrator parts 143 and the aperture stop 150A shown in FIG. 19A. Here, FIG. 20A is a schematic sectional view that solves a problem of the three integrator parts 143 and the aperture stop 150A shown in FIG. 19A. FIG. 20B is a schematic sectional view showing a structure that solves the problem of FIG. 20A.

When the collimated light CL is incident upon the reflection surface of the integrator part 143 at such a relatively high incident angle as 70°, the light is shielded by the thickness of the integrator 143, as shown in FIG. 20A. It is therefore preferable to form each integrator part 143 as thin as possible, but the integrator part 143 should be thick to some extent for a given strength. Accordingly, as shown in FIG. 20B, the integrator part 143 preferably has an approximately triangle pole shape with a thick center portion, and each integrator part 143 preferably includes an adjustment mechanism (not shown).

Figure 20C:
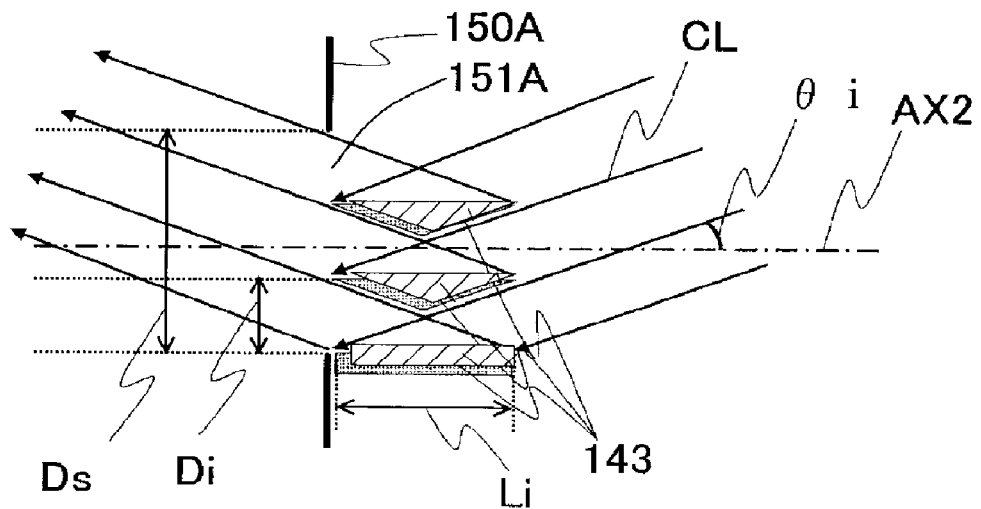

Referring now to FIG. 20C, a description will be given of an optical operation of the three integrator parts 143 and the aperture stop 150A shown in FIG. 19B. Here, FIG. 20C is a schematic sectional view that solves a problem of the three integrator parts 143 and the aperture stop 150A shown in FIG. 19B. When plural integrator parts 143 are used, the reflection surfaces of the adjacent integrator parts 143 are arranged at an approximately regular interval Di. For high efficiency by removing a shadow between the integrator parts, a length Li of the integrator part 143 in the axis AX2 direction preferably meets the following equation where Ds is a diameter of the aperture stop 150A, n is the number of integrator parts, and θi is an angle between the collimated light CL and the axis AX2 parallel to the reflection surface of the integrator part 143. It is understood that an excessively large or small interval Di of the reflection surface cannot efficiently irradiate the collimated light onto the integrator:

$$Ds/n \times 0.9 < Di < Ds/n \times 1.1$$

$$Li = Di/\tan \theta i \qquad \text{EQUATION 1}$$

It is understood from Equation 1 that as the number of integrator parts increases, the length Li of the integrator part 143 becomes shorter, and the illumination efficiency improves since a distance to the aperture stop 150A becomes consequently shorter. On the other hand, the illumination lowers as the number of integrator parts 143 increases because the light is shielded due to the thickness of each integrator part 143. The balanced number of the integrator parts 143 is about 3 or 4.

A description will now be given of an operation of the exposure apparatus 100 or 100A. In exposure, the EUV light radiated from the light source section 110 becomes collimated light CL due to the collimating optical system 131 or 131A, and incident upon the catoptric integrator 140 or 140A. The EUV light that has passed the catoptric integrator 140 or 140A and the aperture stop 150 or 150A forms an effective light source with no distortion, and uniformly arc-illuminates the mask 170 via the arc-shaping optical system 153. The EUV light that reflects the mask pattern is imaged on the plate 190 due to the projection optical system 180. The exposure apparatus 100 or 100A of this embodiment more effectively eliminates the distortion from the effective light source than JP 2005-141158, and provides a high-quality resolution characteristic.

Figure 22:
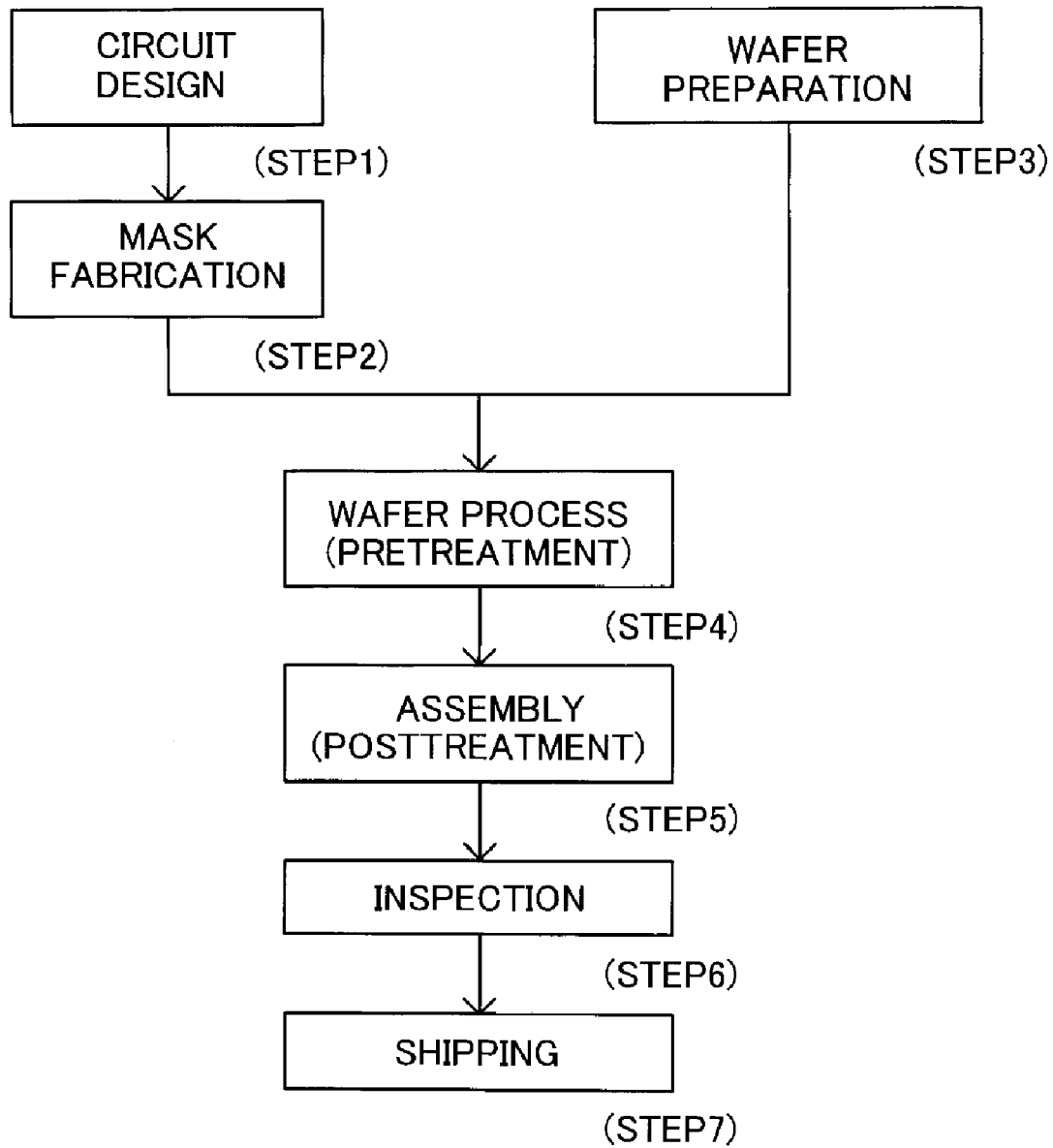
FIG. 22 is a flowchart for explaining a manufacture of a device (such as a semiconductor device and a liquid crystal display device).
Figure 23:
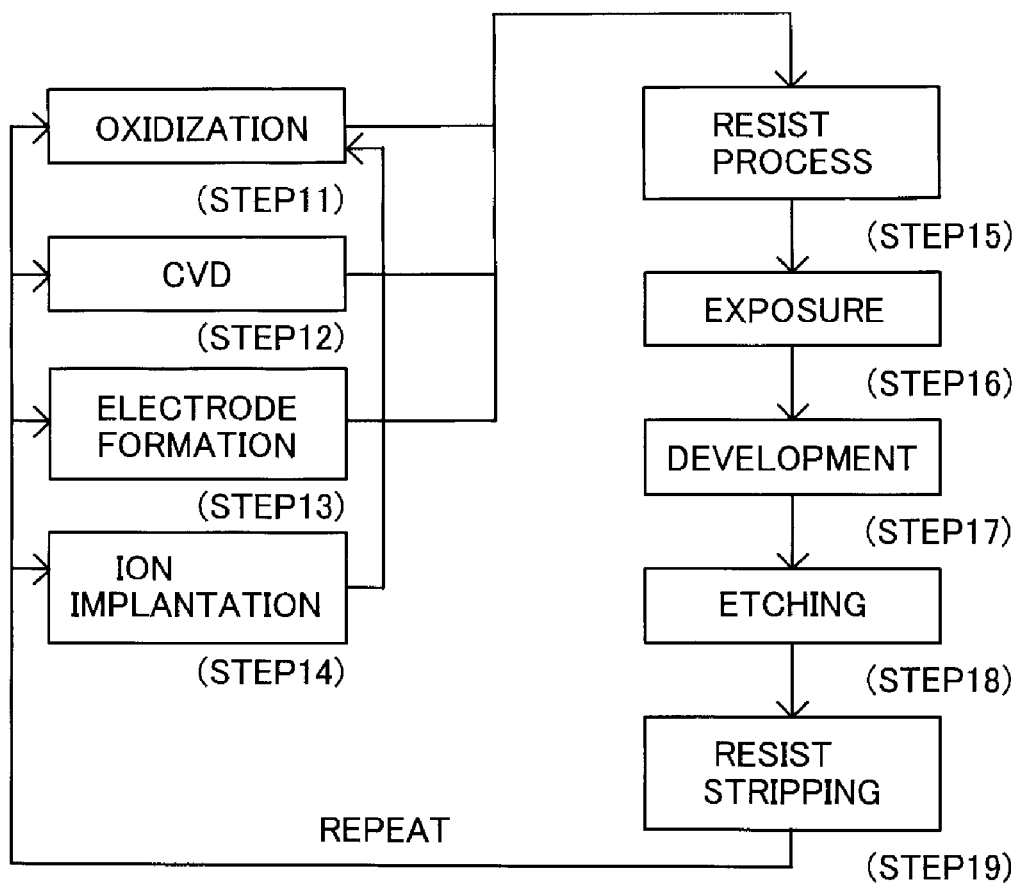
FIG. 23 is a detailed flowchart for a wafer process of step 4 shown in FIG. 22.

Referring now to FIGS. 22 and 23, a description will be given of an embodiment of a device manufacturing method using the exposure apparatus 100 or 100A. FIG. 22 is a flowchart for explaining how to fabricate devices, such as a semiconductor device and a liquid crystal display device. Here, a description will be given of the fabrication of a semiconductor device as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 23 is a detailed flowchart of the wafer process in Step 4 in FIG. 22. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 or 100A to expose the mask pattern onto the wafer. Step 17 (development) develops the exposed wafer. Step 18 (etching) etches parts other than a developed resist image. Step 19 (resist stripping) removes unused resist after etching. These steps are repeated to form multilayer circuit patterns on the wafer. The device manufacturing method of this embodiment may manufacture higher quality devices than ever. Thus, the above device manufacturing method can provide a higher quality device than ever. Thus, the device manufacturing method using the exposure apparatus 100 or 100A, and resultant devices constitute one aspect of the present invention.

The entire disclosure of Japanese Patent Application No. 2006-280783, filed on Oct. 13, 2006, including claims, specification, drawings and abstract incorporated herein by reference in its entirety.

As many apparently widely different embodiments of the present invention can be made without departing from the spirit and scope thereof, it is to be understood that the invention is not limited to the specific embodiments thereof except as defined in the claims. For example, while this embodiment uses the EUV light, the present invention is applicable to a light source in a vacuum UV or x-ray region.

What is claimed is:

1. An exposure apparatus comprising:
    a first optical unit configured to condense light from a light source;
    a catoptric integrator configured to form plural secondary light sources using light from the first optical unit, the catoptric integrator including plural cylindrical reflection surfaces having the same generatrix direction;
    an aperture stop arranged perpendicular to the generatrix direction; and
    a second optical unit configured to superpose light from each secondary light source onto an illumination surface,
    wherein the catoptric integrator includes plural integrator parts each having plural cylindrical reflection surfaces, and the plural integrator parts are arranged in a direction perpendicular to the generatrix direction and to an arrangement direction of the cylindrical reflection surfaces and located at an incident side of the aperture stop.

2. An exposure apparatus according to claim 1, wherein the catoptric integrator includes first and second integrator parts each having the plural cylindrical reflection surfaces, a first plane mirror adjacent to the first integrator part, and a second plane mirror adjacent to the second integrator part, the first and second integrator parts being arranged at the incident side of the aperture stop while respective reflection surfaces oppose to each other, the first plane mirror being located at the incident side of the aperture stop, the second plane mirror being located at an exit side of the aperture stop, light reflected on the first integrator part passing an aperture of the aperture stop and entering the second plane mirror, and light reflected on the first plane mirror entering the second integrator part.

3. An exposure apparatus according to claim 2, wherein the aperture of the aperture stop has a shape of half an effective light source.

4. An exposure apparatus according to claim 1, wherein the plural integrators are arranged at the incident side of the aperture stop so that respective reflection surfaces face the same direction.

5. An exposure apparatus according to claim 4, wherein the aperture of the aperture stop has the same shape of an effective light source.

6. An exposure apparatus according to claim 5, wherein a cylindrical reflection surface of the integrator part most distant from a center of the aperture stop is adjacent to an outline of the aperture stop.

7. A device manufacturing method comprising the steps of:
    exposing a substrate using an exposure apparatus according to claim 1; and
    developing the substrate that has been exposed.

* * * * *